US011906701B2

(12) United States Patent
Hebrink et al.

(10) Patent No.: US 11,906,701 B2
(45) Date of Patent: Feb. 20, 2024

(54) ANTI-REFLECTIVE SURFACE STRUCTURES

(71) Applicant: 3M INNOVATIVE PROPERTIES COMPANY, St. Paul, MN (US)

(72) Inventors: Timothy J. Hebrink, Scandia, MN (US); Todd G. Pett, St. Paul, MN (US); Moses M. David, Wells, TX (US); James P. Burke, St. Paul, MN (US); Vivian W. Jones, Woodbury, MN (US); Haiyan Zhang, Lake Elmo, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 274 days.

(21) Appl. No.: 15/733,255

(22) PCT Filed: Dec. 21, 2018

(86) PCT No.: PCT/IB2018/060527
§ 371 (c)(1),
(2) Date: Jun. 17, 2020

(87) PCT Pub. No.: WO2019/130198
PCT Pub. Date: Jul. 4, 2019

(65) Prior Publication Data
US 2021/0096279 A1    Apr. 1, 2021

Related U.S. Application Data

(60) Provisional application No. 62/611,636, filed on Dec. 29, 2017.

(51) Int. Cl.
*G02B 1/118*    (2015.01)
*B29D 11/00*    (2006.01)
(Continued)

(52) U.S. Cl.
CPC .......... *G02B 1/118* (2013.01); *B29D 11/0074* (2013.01); *E04D 13/03* (2013.01); *H01L 31/02168* (2013.01); *H02S 20/23* (2014.12)

(58) Field of Classification Search
CPC ..... G02B 1/118; B29D 11/0074; E04D 13/03; H01L 31/02168; H02S 20/23
(Continued)

(56) References Cited

U.S. PATENT DOCUMENTS 5,971,326 A    10/1999    Bechert
6,365,949 B1 *  4/2002    Ruiter .................... H01B 1/22
                                           438/30
(Continued)

FOREIGN PATENT DOCUMENTS

CN    101475173    7/2009
WO    WO 2000-048037    8/2000
(Continued)

OTHER PUBLICATIONS

R. Maboudian; "Micro Devices: Stiction and Adhesion"; 2001; Encyclopedia of Materials: Science and Technology; ISBN: 0-08-0431526; pp. 5591-5594; Elsevier Science Ltd.*
(Continued)

*Primary Examiner* — William R Alexander
*Assistant Examiner* — Sharrief I Broome
(74) *Attorney, Agent, or Firm* — Thomas M. Spielbauer; Lynn R. Hunsberger

(57) ABSTRACT

Anti-reflective article includes a layer defining an anti-reflective surface. The anti-reflective surface includes a series of alternating micro-peaks and micro-spaces extending along an axis. The surface also includes a series of nano-peaks extending along an axis. The nano-peaks are disposed at least on the micro-spaces and, optionally, the micro-peaks. The article may be disposed on a photovoltaic
(Continued)

module or skylight to reduce reflections and resist the collection of dust and dirt.

20 Claims, 14 Drawing Sheets

(51) Int. Cl.
    *E04D 13/03*     (2006.01)
    *H01L 31/0216*     (2014.01)
    *H02S 20/23*     (2014.01)

(58) Field of Classification Search
    USPC .......................................................... 359/601
    See application file for complete search history.

(56) References Cited

U.S. PATENT DOCUMENTS

| | | |
|---|---|---|
| 7,328,638 B2 | 2/2008 | Gardiner |
| 7,350,442 B2 | 4/2008 | Ehnes |
| 7,968,790 B2 | 6/2011 | Raymod |
| 8,460,568 B2 | 6/2013 | David |
| 8,634,146 B2 | 1/2014 | David |
| 9,285,584 B2 | 3/2016 | Hebrink |
| 9,670,300 B2 | 6/2017 | Olson |
| 2007/0256732 A1 | 11/2007 | Shen |
| 2009/0147361 A1 | 6/2009 | Gardiner |
| 2010/0151207 A1 | 6/2010 | Hansen |
| 2012/0080085 A1 | 4/2012 | Honeker |
| 2012/0199198 A1* | 8/2012 | Hebrink ............. C08G 18/4236 126/698 |
| 2013/0040126 A1* | 2/2013 | Pett ........................... C09D 1/00 977/773 |
| 2013/0052425 A1* | 2/2013 | Tsai ....................... G03F 7/0002 205/50 |
| 2013/0128362 A1* | 5/2013 | Song ....................... G02B 1/118 359/601 |
| 2013/0236697 A1* | 9/2013 | Walker, Jr. .............. G02B 1/118 83/13 |
| 2013/0258483 A1 | 10/2013 | Pett |
| 2017/0067150 A1 | 3/2017 | David |
| 2017/0198129 A1 | 7/2017 | Olson |
| 2017/0227682 A1* | 8/2017 | Free ........................ C03C 17/28 |
| 2018/0006164 A1* | 1/2018 | Roca I Cabarrocas ..................... H01L 31/18 |

FOREIGN PATENT DOCUMENTS

| | | |
|---|---|---|
| WO | WO 2011-056401 | 5/2011 |
| WO | WO 2015-168499 | 11/2015 |
| WO | WO 2017-172564 | 10/2017 |
| WO | WO 2018-130926 | 7/2018 |

OTHER PUBLICATIONS

Sun, "Fabrication of micro/nano dual scale structures by improved deep reactive ion etching", J. Micromech Microeng, 2010, vol. 20, pp. 01-09.

International Search report for PCT International Application No. PCT/IB2018/060527 dated Apr. 10, 2019, 5 pages.

* cited by examiner

| Incident Light Angle | Power % Increase 0deg | Power % Increase 45deg | Power % Increase 60deg |
|---|---|---|---|
| item 1 Riblet before dirt | 3.7% | 6.0% | 11.9% |
| item 2 Riblet-RIE before dirt | 3.7% | 6.2% | 12.3% |
| item 3 STR - before dirt | 2.5% | 3.9% | 9.6% |
| item 4 STR - RIE - before dirt | 2.9% | 6.0% | 10.7% |
| item 5 Riblet after exposure to dirt | 0.0% | 0.0% | 0.0% |
| item 6 Riblet - RIE after exposure to dirt | 1.2% | 0.0% | 0.0% |
| item 7 STR - after exposure to dirt | 2.1% | 1.7% | 3.0% |
| item 8 STR - RIE - after exposure to dirt | 3.1% | 3.9% | 7.3% |
| item 9 Riblet after washing | 2.2% | 0.8% | 3.3% |
| item 10 Riblet - RIE after washing | 2.4% | 1.6% | 5.0% |
| item 11 STR - after washing | 2.4% | 2.8% | 7.7% |
| item 12 STR - RIE - after washing | 2.8% | 5.9% | 10.5% |

FIG. 7

Haze Gard
BYK Gardner

%Transmission Minus Second Surface Reflection

| Sample Description | Before Dirt %Transmission | After Dirt Exposure %Transmission | After Washing %Transmission |
|---|---|---|---|
| PVDF STR | 96.30 | 92.20 | 95.80 |
| PVDF-STR-RIE | 97.60 | 95.00 | 96.70 |
| HTE1705 STR | 96.50 | 93.50 | 95.60 |
| HTE1705 STR-RIE | 97.40 | 96.00 | 97.00 |
| PVDF Smooth | 95.50 | 90.30 | 95.00 |
| PVDF Matte | 96.00 | 82.00 | 95.00 |
| ETFE Smooth | 92.80 | 91.00 | 92.50 |
| ETFE Matte | 95.60 | 80.60 | 95.10 |
| THV815 3-Layer STR | 96.1 | 89.9 | 95.2 |
| THV815 3-Layer STR-RIE | 96.5 | 94.1 | 95.9 |

FIG. 14

ANTI-REFLECTIVE SURFACE STRUCTURES

CROSS REFERENCE TO RELATED APPLICATIONS

This application is a national stage filing under 35 U.S.C. 371 of PCT/IB2018/060527, filed Dec. 21, 2018, which claims the benefit of U.S. Application No. 62/611,636, filed Dec. 29, 2017, the disclosure of which is incorporated by reference in its/their entirety herein.

BACKGROUND

Anti-reflective surfaces are used in solar energy applications. For example, reflections off the front surface of photovoltaic modules can reduce their power output by greater than 3%. Significant effort has been made to solve this problem in the industry. In one example, sintered nano-silica solution coatings have provided 1-2% reductions in surface reflection resulting in 1-2% increases in photovoltaic power output. In another example, micro-structured prisms applied to the front surface of photovoltaics have provided even greater than 3% increase in photovoltaic module power output but have suffered from reduced photovoltaic power output when subjected to environmental conditions, such as dust and dirt. It would be desirable to have additional choices or alternatives when designing anti-reflective surfaces that are exposed to environmental contaminants, such as dust and dirt.

SUMMARY

The present disclosure relates to anti-reflective surfaces. In particular, the present disclosure relates to anti-reflective surface structures including micro-structures and nano-structures. The micro-structures may be arranged as at least one series of alternating micro-peaks and micro-spaces. The nano-structures may be arranged as at least one series of nano-peaks disposed on the micro-spaces and, optionally, the micro-peaks.

Various aspects of the present disclosure relate to an article having a layer defining an anti-reflective surface extending along an axis. A plane containing the axis defines a cross section of the layer and intersects the surface to define a line describing a cross-sectional profile of the surface. The layer includes a series of micro-structures at least partially defined by the line. The line defines a series of alternating micro-peaks and micro-spaces along the axis. Each micro-space includes a maximum absolute slope defining an angle from the axis of at most 30 degrees. Each micro peak comprises a first micro-segment defining a first average slope and a second micro-segment defining a second average slope. An angle formed between the first and second average slopes is at most 120 degrees. The layer also includes a plurality of nano-structures at least partially defined by the line. The line defines at least one series of nano-peaks disposed on at least the micro-spaces along the axis. Each nano-peak has a height and each corresponding micro-peak has a height of at least 10 times the height of the nano-peak.

Various aspects of the present disclosure relate to an article having a layer defining an anti-reflective surface extending along an axis. A plane containing the axis defines a cross section of the layer and intersects the surface to define a line describing a cross-sectional profile of the surface. The layer includes a series of micro-structures at least partially defined by the line. The line defines a series of alternating micro-peaks and micro-spaces along the axis. A boundary between each adjacent micro-peak and micro-space includes at least one of a bend or an inflection point of the line. The layer also includes a plurality of nano-structures at least partially defined by the line. The line defines at least one series of nano-peaks disposed on at least the micro-spaces along the axis. Each nano-peak has a height and each corresponding micro-peak has a height of at least 10 times the height of the nano-peak.

Various aspects of the present disclosure relate to a method of forming an article comprising a layer defining an anti-reflective surface. The method includes forming a series of micro-structures on a surface of a layer. The series of micro-structures includes a series of alternating micro-peaks and micro-spaces along an axis. The method also includes disposing a series of nano-sized masking elements on at least the micro-spaces along the axis. The masking elements define a maximum diameter and the corresponding micro-peaks have a height of at least 10 times the maximum diameter of the masking elements. The method further includes exposing the surface of the layer to reactive ion etching to form a plurality of nano-structures on the surface of the layer including a series of nano-peaks along the axis. Each nano-peak includes the masking element and a column between the masking element and the layer.

Various aspects of the present disclosure relate to a method of forming an article comprising a layer defining an anti-reflective surface. The method includes extruding a hot melt material comprising an ultraviolet-stable material. The method also includes shaping the extruded material with a micro-replication tool comprising a mirror image of a series of micro-structures to form the series of micro-structures on the surface of the layer. The series of micro-structures includes a series of alternating micro-peaks and micro-spaces along an axis. The method further includes forming a plurality of nano-structures on the surface of the layer on at least the micro-spaces. The plurality of nano-peaks includes at least one series of nano-peaks along the axis.

This disclosure may be more completely understood in consideration of the following drawings and the accompanying detailed description of various aspects of the disclosure.

All scientific and technical terms used herein have meanings commonly used in the art unless otherwise specified. The definitions provided herein are to facilitate understanding of certain terms used frequently herein and are not meant to limit the scope of the present disclosure.

As used herein, the term "light" refers to energy in the electromagnetic spectrum that may be characterized by wavelength. Non-limiting examples of "light" include solar energy, infrared (IR) light, visible light, or ultraviolet (UV) light. Solar energy may include at least one of IR light, visible light, or UV light.

As used herein, the term "average percent (%) transmission" refers to results of light measurement techniques described in the Examples. Increases in transmission may also be measured indirectly, by increases in photovoltaic module power output when a film to be measured is laminated to the surface of a photovoltaic module.

As used herein, the term "average percent (%) reflection" refers to a value calculated from the average percent (%) transmission. In particular, the % reflection (% R) may be calculated based on the % transmission (% T) at each sampled frequency. The calculated % R may be averaged to determine the average percent % R of light.

As used herein, "transparent" refers to a polymeric film having greater than 1% average transmission of light.

As used herein, the term "anti-reflective" refers to a low average % reflection, or a high average % transmission, for a transparent polymeric film.

As used herein, the term or prefix "micro" refers to at least one dimension defining a structure or shape being in a range from 1 micrometer to 1 millimeter. For example, a micro-structure may have a height or a width that is in a range from 1 micrometer to 1 millimeter.

As used herein, the term or prefix "nano" refers to at least one dimension defining a structure or a shape being less than 1 micrometer. For example, a nano-structure may have at least one of a height or a width that is less than 1 micrometer.

As used herein, the term "ultraviolet stable material" refers to materials resistant to photo-degradation by ultra-violet (UV) light as measured by a change in color with colorimeter (e.g., a colorimeter available under the trade designation "HUNTER LAB" from Hunter Associates Laboratory, Inc., Reston, VA), or as measured by a loss in light transmission using a spectrophotometer (e.g., a spectrophotometer available under the trade designation "PERKINELMER LAMBDA 1050" available from PerkinElmer, Hopkinton, MA). Non-limiting examples of inherently UV stable polymers include fluoropolymers and silicone polymers. Other polymers, such as acrylates, polyethylenes, polyolefins, cyclic olefin copolymers, and urethanes, can be made UV stable with the addition of ultra-violet absorbers (UVAs) and hindered amine light stabilizers (HALS).

As used herein, the term "fluoropolymer" refers to at least one polymer including fluorine. Non-limiting examples of fluoropolymers include polyvinylidene fluoride (PVDF), copolymers of polyvinylidene fluoride and hexafluoropropylene (CoPVDF), copolymers of hexafluoropropylene, tetrafluoroethylene, and ethylene (HTE), copolymers of ethylene and tetrafluoroethylene (ETFE), copolymers of fluorinated ethylene and fluorinated propylene (FEP), copolymers of ethylene and chlorotrifluoroethylene (ECTFE), and copolymers of tetrafluoroethylene, hexafluoropropylene, and vinylidene fluoride (THV). A fluoropolymer can be used in combination with at least one other fluoropolymer.

As used herein, the term "polyolefin polymer" refers to at least one polymer including a polyolefin. Non-limiting examples of polyolefins include low-density polyethylene (LDPE), medium-density polyethylene (MDPE), cyclic olefin polymer (COP), cyclic olefin copolymer (COC), polymethylpentene (PMP), and high-density polyethylene (HDPE).

As used herein, the term "self-wetting" refers to the ability of liquids to form interfaces with solid surfaces. To determine the degree of wetting, the contact angle (q) that is formed between the liquid and the solid surface is measured. The smaller the contact angle and the smaller the surface tension, the greater the degree of wetting may be. Effective wetting may require the surface tension of the adhesive to be less than or equal to that of the substrate. Preferably, self-wetting adhesives do not trap air bubbles between the adhesive and the substrate adhered thereto.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g., 1 to 5 includes 1, 1.5, 2, 2.75, 3, 3.80, 4, and 5) and any range within that range. Herein, the terms "at most" or "no greater than" a number (e.g., up to 50) includes the number (e.g., 50), and the term "at least" a number (e.g., no less than 5) includes the number (e.g., 5).

The term "coupled" refers to elements being attached to each other either directly (in direct contact with each other) or indirectly (having at least element between and attaching the two elements).

Terms related to orientation, such as "top," "bottom," "side," and "end," are used to describe relative positions of components and are not meant to limit the orientation of the embodiments contemplated. For example, an embodiment described as having a "top" and "bottom" also encompasses embodiments thereof rotated in various directions unless the content clearly dictates otherwise.

Reference to "one embodiment," "an embodiment," "certain embodiments," or "some embodiments," etc., means that a particular feature, configuration, composition, or characteristic described in connection with the embodiment is included in at least one embodiment of the disclosure. Thus, the appearances of such phrases in various places throughout are not necessarily referring to the same embodiment of the disclosure. Furthermore, the particular features, configurations, compositions, or characteristics may be combined in any suitable manner in some embodiments.

As used in this specification and the appended claims, the singular forms "a," "an," and "the," encompass embodiments having plural referents, unless the content clearly dictates otherwise. As used in this specification and the appended claims, the term "or" is generally employed in its sense including "and/or" unless the content clearly dictates otherwise.

As used herein, "have," "having," "include," "including," or "comprise," "comprising," are used in their open-ended sense, and generally mean "including, but not limited to." It will be understood that "consisting essentially of," and "consisting of," are subsumed in "comprising."

The term "and/or" means one or all of the listed elements or a combination of at least two of the listed elements.

BRIEF DESCRIPTION OF THE DRAWINGS

FIG. 2A shows a perspective view of a cross section relative to xyz-axes. FIG. 2C shows the cross section of FIG. 2A in an xz-plane. FIG. 2B shows another cross section in a yz-plane.

FIG. 7 is a table showing the data used to generate the chart of FIG. 6.

FIG. 14 is a table showing percent transmission of various films.

DETAILED DESCRIPTION

Figure 1:
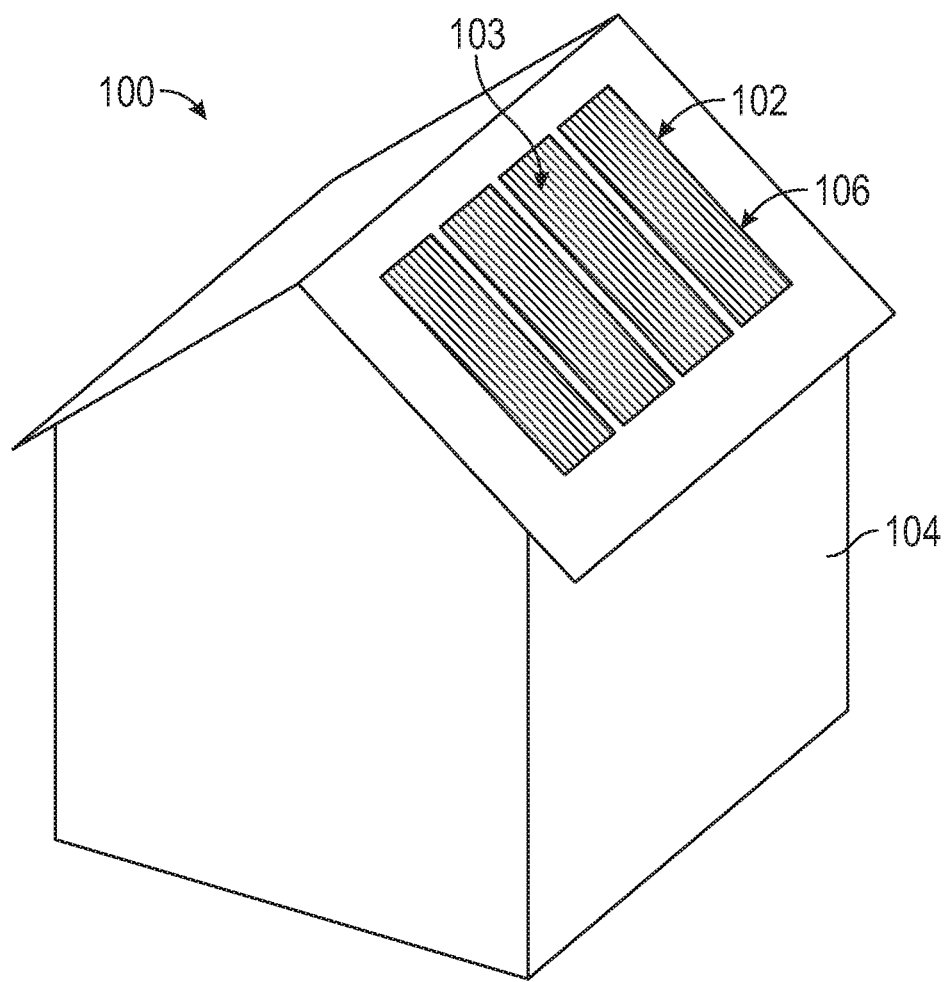
FIG. 1 is a perspective illustration of an environment for use with an anti-reflective surface structure including a building and a photovoltaic module or skylight.

In general, the present disclosure may provide durable, anti-reflective surfaces that are capable of withstanding outdoor elements (e.g., ultraviolet (UV) exposure, humidity, rain, dust, and dirt). Although reference is made to solar energy applications, such as photovoltaic (PV) modules, the anti-reflective surfaces described herein may be used with any application that may benefit from a durable, anti-reflective surface that resists dirt. Various other applications will become apparent to one of ordinary skill in the art having the benefit of the present disclosure.

More particularly, the present disclosure may provide anti-reflective surfaces including micro-structures and nano-structures. The micro-structures may be arranged as a series of alternating micro-peaks and micro-spaces. The micro-peaks may provide anti-reflective properties based, at least, on the average slope of their side segments. The size and shape of the micro-spaces between micro-peaks may mitigate the adhesion of dirt particles to the micro-peaks. The nano-structures may be arranged as at least one series of nano-peaks disposed on at least the micro-spaces. The nano-structures may improve the anti-reflective properties of the micro-spaces, which have a lower maximum slope compared to the micro-peaks. The micro-peaks may be more durable to environmental effects than the nano-peaks. Because the micro-peaks are spaced only by a micro-space, and the micro-spaces are significantly taller than the nano-peaks, the micro-peaks may serve to protect the nano-peaks on the surface of the micro-spaces from abrasion. Optionally, the nano-peaks may be disposed on the micro-peaks to further improve anti-reflective properties.

In some applications, an anti-reflective surface may be part of a layer that is disposed on a PV module. Advantageously, the anti-reflective surfaces of the present disclosure may provide a desirable reduction in surface reflection over a wide range of incident light angles to improve long-term PV power output. These surfaces may also mitigate the collection of dirt on, or facilitate the ease of removing dirt from, the surface of the photovoltaic module compared to conventional micro-structured prisms, which may further improve long-term PV power output and may mitigate maintenance costs (e.g., to clean the PV surface). Further, these surfaces may be designed to be durable in outdoor environments, which may mitigate maintenance costs (e.g., to replace the anti-reflective layer).

Anti-reflective surface structures described herein may also be beneficial for masking the appearance of photovoltaic modules for aesthetic reasons. Pigments, or dyes, may be added to the surface structures to further enhance the masking benefits of the anti-reflective surface structures. Anti-reflection may further be beneficial for reducing unwanted specular reflection, or glare, which may be undesirable near airports or roads for practical reasons.

In some building applications, anti-reflective films may increase daylighting into buildings, such as clerestory windows, skylights, and greenhouses. In some solar thermal applications, which may utilize a non-transparent film, anti-reflective surfaces may increase absorption of solar energy, which may be beneficial. In some applications, anti-reflective surfaces on a mirror (e.g., a mirror film) may reduce undesirable specular reflection and provide desirable diffuse reflection for aesthetic or practical reasons.

Reference will now be made to the drawings, which depict at least one aspect described in this disclosure. Like numbers used in the figures refer to like components, steps, and the like. However, it will be understood that the use of a reference character to refer to an element in each figure is not intended to limit the element in another figure labeled with the same reference character. In addition, the use of different reference characters to refer to elements in different figures is not intended to indicate that the differently referenced elements cannot be the same or similar.

FIG. 1 shows environment 100 for use with anti-reflective surface structure 102 including building 104 and photovoltaic module or skylight 106. Anti-reflective surface structure 102 may be disposed on any substrate that can benefit from anti-reflective properties to allow more incident light, particularly at various angles, to be transmitted through the surface without being reflected. As illustrated, the substrate is part of photovoltaic module or skylight 106. A photovoltaic module may be capable of receiving solar energy, converting solar energy into electricity, and supplying electrical energy. A skylight may transmit sunlight through to an interior of the building 104. Four anti-reflective surface structures 102 are shown disposed on four photovoltaic modules or skylights 106 for illustrative purposes. However, any number of anti-reflective surface structures 102 may be used per substrate.

A photovoltaic module may benefit from the anti-reflective surface structure 102 by being able to output increased electrical energy due to the increased incident light that may have otherwise been reflected away from the module. A skylight may benefit from the anti-reflective surface structure 102 by being able to increase the amount of sunlight transmitted into the building 104.

Photovoltaic module 106 may be located in outdoor environment 100 and subjected to a variety of environmental conditions. In some embodiments, outdoor environment 100 may expose anti-reflective surface structure 102 to environmental conditions (e.g., dust, precipitation, or wind). It may be beneficial for anti-reflective surface structure 102 to be durable for use in at least these environmental conditions. The anti-reflective surface structure 102 may be oriented to allow environmental contaminants, such a dust, to be easily washed away (e.g., when it rains). The anti-reflective structure 102 may include a series of ridges and channels 103 that extend at least partially in a vertical direction, so that dust and rain water may run down the channels. The ridges and channels 103, when viewed in a cross section, may resemble alternating peaks and spaces as described herein in more detail.

Figure 2A:
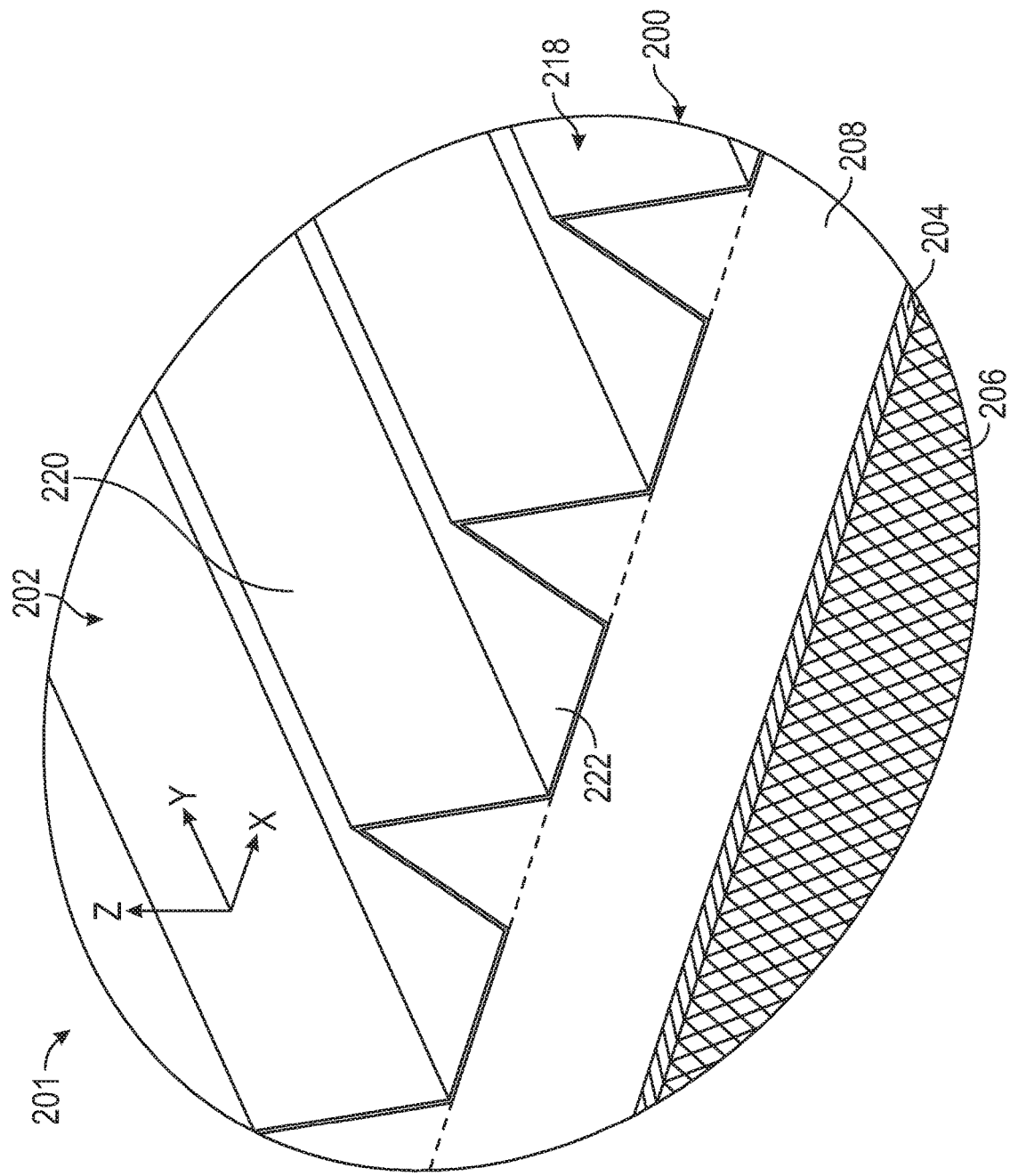
FIGS. 2A, 2B, and 2C are views of an anti-reflective surface structure having micro-structures.
Figure 2B:
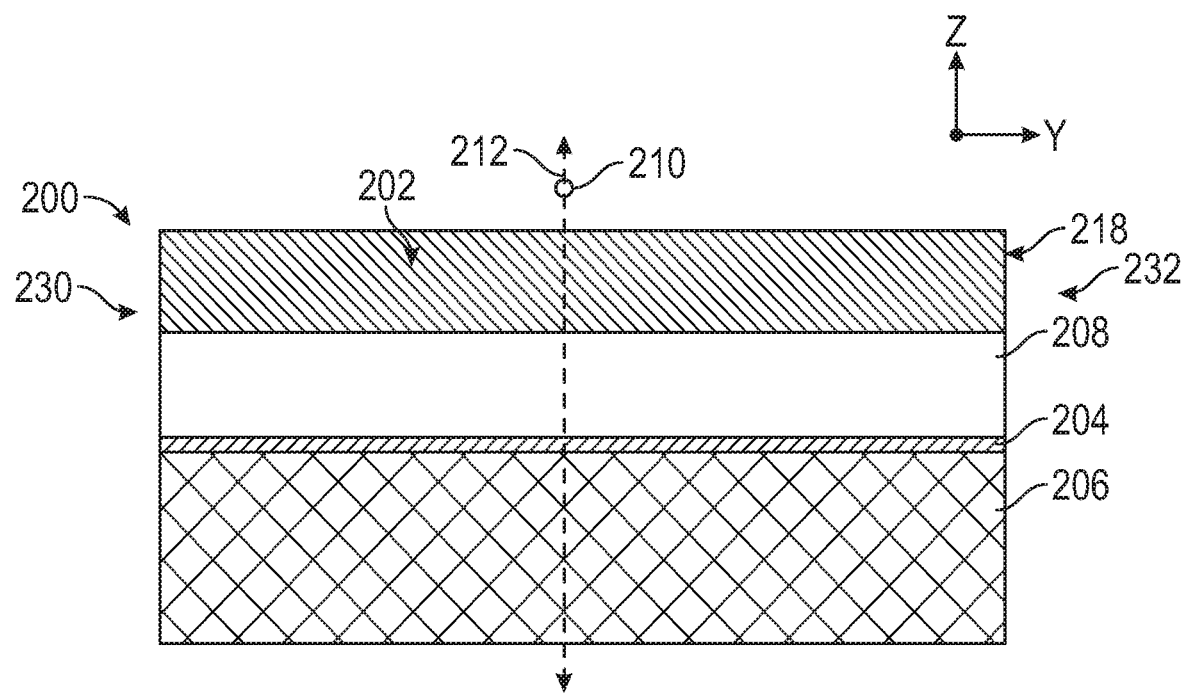
Figure 2C:
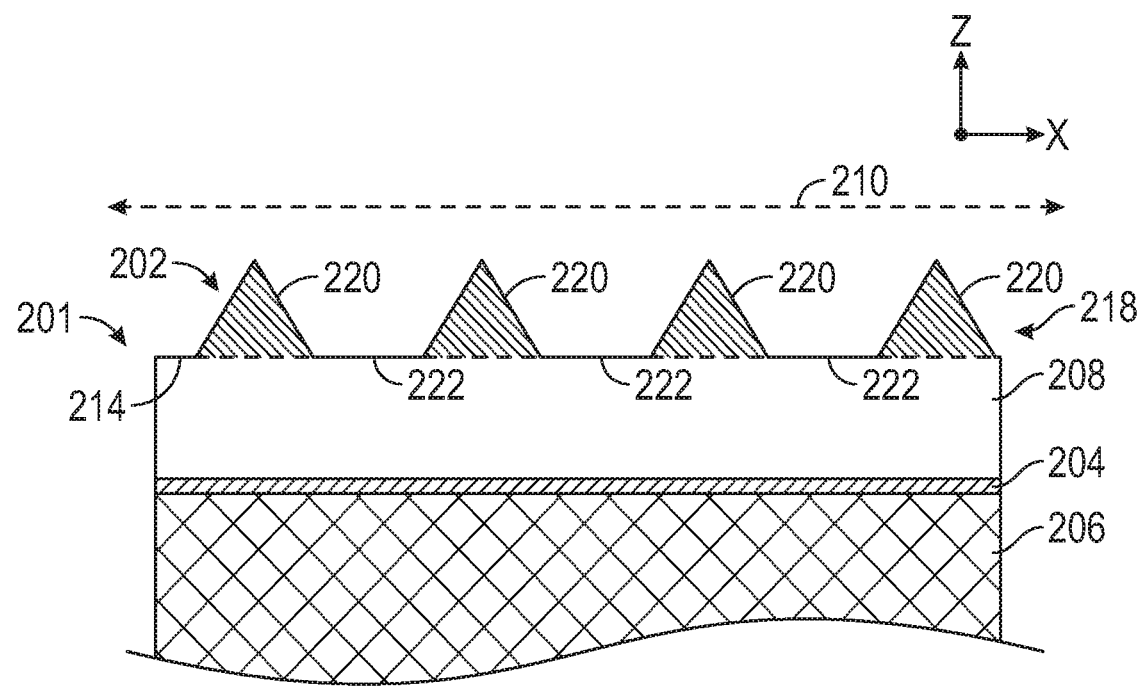

FIGS. 2A, 2B, and 2C show cross-sections 200, 201 of an anti-reflective surface structure, shown as anti-reflective layer 208 having anti-reflective surface 202 defined by a series of micro-structures 218. The cross-sections 200, 201 also show substrate 206 and adhesive 204 between the anti-reflective layer 208 and the substrate. In particular, FIG. 2A shows a perspective view of the cross section 201 relative to xyz-axes. FIG. 2C shows cross section 201 in an xz-plane parallel to axis 210. FIG. 2B shows cross section 200 in a yz-plane orthogonal to cross section 201 and orthogonal to axis 210. Anti-reflective surface 202 is depicted in FIGS. 2A-2C as if layer 208 were lying on a flat horizontal surface. Layer 208, however, may be flexible and may conform to substrates that are not flat.

Anti-reflective surface 202 may be formed on at least one surface of the layer 208. In some embodiments, micro-structures 218 are formed in layer 208. Micro-structures 218 and remaining portions of layer 208 below the micro-structures may be formed of the same material. Layer 208 may be formed of any suitable material capable of defining micro-structures 218, which may at least partially define anti-reflective surface 202. Layer 208 may be transparent to various frequencies of light, such as the frequencies found in solar energy captured by photovoltaic module 106 (FIG. 1). In at least one embodiment, layer 208 may be non-transparent, or even opaque, to various frequencies of light. In some embodiments, layer 208 may include an UV stable material. In some embodiments, layer 208 may include a polymer material, such as a fluoropolymer or a polyolefin polymer.

Layer 208 may be disposed on substrate 206. Substrate 206 may be part of a larger article, apparatus, or system (e.g., photovoltaic module 106 (FIG. 1) or a window of building 104 (FIG. 1)). In some embodiments, substrate 206 may include a light transparent material (e.g., glass) to allow transmission of various frequencies of light. For example, photovoltaic module 106 may include substrate 206, which may be made of glass and may cover the photovoltaic cells that absorb light for conversion into electricity. In some embodiments, substrate 206 can be a flexible barrier film such as available under the tradename "3M ULTRA BARRIER SOLAR FILM UBF512," available from 3M Company, St. Paul, MN. Flexible barrier films are used to protect flexible photovoltaic modules, such as copper indium gallium selenide (CIGS), copper zinc tin sulfide (CZTS), organic photovoltaic (OPV), transparent OPV, semi-transparent OPV, and perovskite solar cells.

A layer of adhesive 204 may be disposed between layer 208 and substrate 206. In some embodiments, adhesive 204 may be in direct contact with at least one of layer 208 or substrate 206. Adhesive 204 may be formed of any suitable material capable of adhering to at least one of layer 208 or substrate 206. In some embodiments, adhesive 204 may include a UV stable material. A non-limiting example of an inherently UV stable adhesive is a silicone adhesive or other UV stable material suitable for adhesives (e.g., an acrylate).

Adhesive 204 may be laid down on the substrate 206 without creating air bubbles therebetween. In some embodiments, adhesive 204 may be any suitable adhesive capable of self-wetting to glass, which may be commercially available. Alternatively, or additionally, adhesive 204 may be any suitable air bleed adhesive, which may be commercially available. Air bleed adhesive may have surface structures in the form of channels which allow air to bleed out from under the adhesive while it is being laminated to glass or other substrates (e.g., mirror films).

Anti-reflective surface 202 may extend along axis 210, for example, parallel or substantially parallel to the axis. Plane 212 may contain axis 210, for example, parallel or intersecting such that axis 210 is in plane 212. Both axis 210 and plane 212 may be imaginary constructs used herein to illustrate various features related to anti-reflective surface 202. For example, the intersection of plane 212 and anti-reflective surface 202 may define line 214 describing a cross-sectional profile of the surface as shown in FIG. 2C that includes micro-peaks 220 and micro-spaces 222 as described herein in more detail. Line 214 may include at least one straight segment or curved segments.

Line 214 may at least partially define series of micro-structures 218. Micro-structures 218 may be three-dimensional (3D) structures disposed on layer 208, and line 214 may describe only two dimensions (e.g., height and width) of that 3D structure. As can be seen in FIG. 2B, micro-structures 218 may have a length that extends along surface 202 from one side 230 to another side 232.

Micro-structures 218 may include a series of alternating micro-peaks 220 and micro-spaces 222 along, or in the direction of, axis 210, which may be defined by, or included in, line 214. The direction of axis 210 may coincide with a width dimension. Micro-spaces 222 may each be disposed between pair of micro-peaks 220. In other words, plurality of micro-peaks 220 may be separated from one another by at least one micro-spaces 222. In at least one embodiments, at least one pair of micro-peaks 220 may not include micro-space 222 in-between. Pattern of alternating micro-peaks 220 and micro-spaces 222 may be described as a "skipped tooth riblet" (STR). Each of micro-peaks 220 and micro-spaces 222 may include at least one straight segment or curved segment.

A slope of line 214 (e.g., rise over run) may be defined relative to the direction of axis 210 as an x-coordinate (run) and relative to the direction of plane 212 as a y-axis (rise).

A maximum absolute slope may be defined for at least one portion of line 214. As used herein, the term "maximum absolute slope" refers to a maximum value selected from the absolute value of the slopes throughout a particular portion of line 214. For example, the maximum absolute slope of one micro-space 222 may refer to a maximum value selected from calculating the absolute values of the slopes at every point along line 214 defining the micro-space.

A line defined the maximum absolute slope of each micro-space 222 may be used to define an angle relative to axis 210. In some embodiments, the angle corresponding to the maximum absolute slope may be at most 30 (in some embodiments, at most 25, 20, 15, 10, 5, or even at most 1) degrees. In some embodiments, the maximum absolute slope of at least some (in some embodiments, all) of micro-peaks 220 may be greater than the maximum absolute slope of at least some (in some embodiments, all) of micro-spaces 222.

In some embodiments, line 214 may include boundary 216 between each adjacent micro-peak 220 and micro-space 222. Boundary 216 may include at least one of straight segment or curved segment. Boundary 216 may be a point along line 214. In some embodiments, boundary 216 may include a bend. The bend may include the intersection of two segments of line 214. The bend may include a point at which line 214 changes direction in a locale (e.g., a change in slope between two different straight lines). The bend may also include a point at which line 214 has the sharpest change in direction in a locale (e.g., a sharper turn compared to adjacent curved segments). In some embodiments, boundary 216 may include an inflection point. An inflection point may be a point of a line at which the direction of curvature changes.

Figure 3:
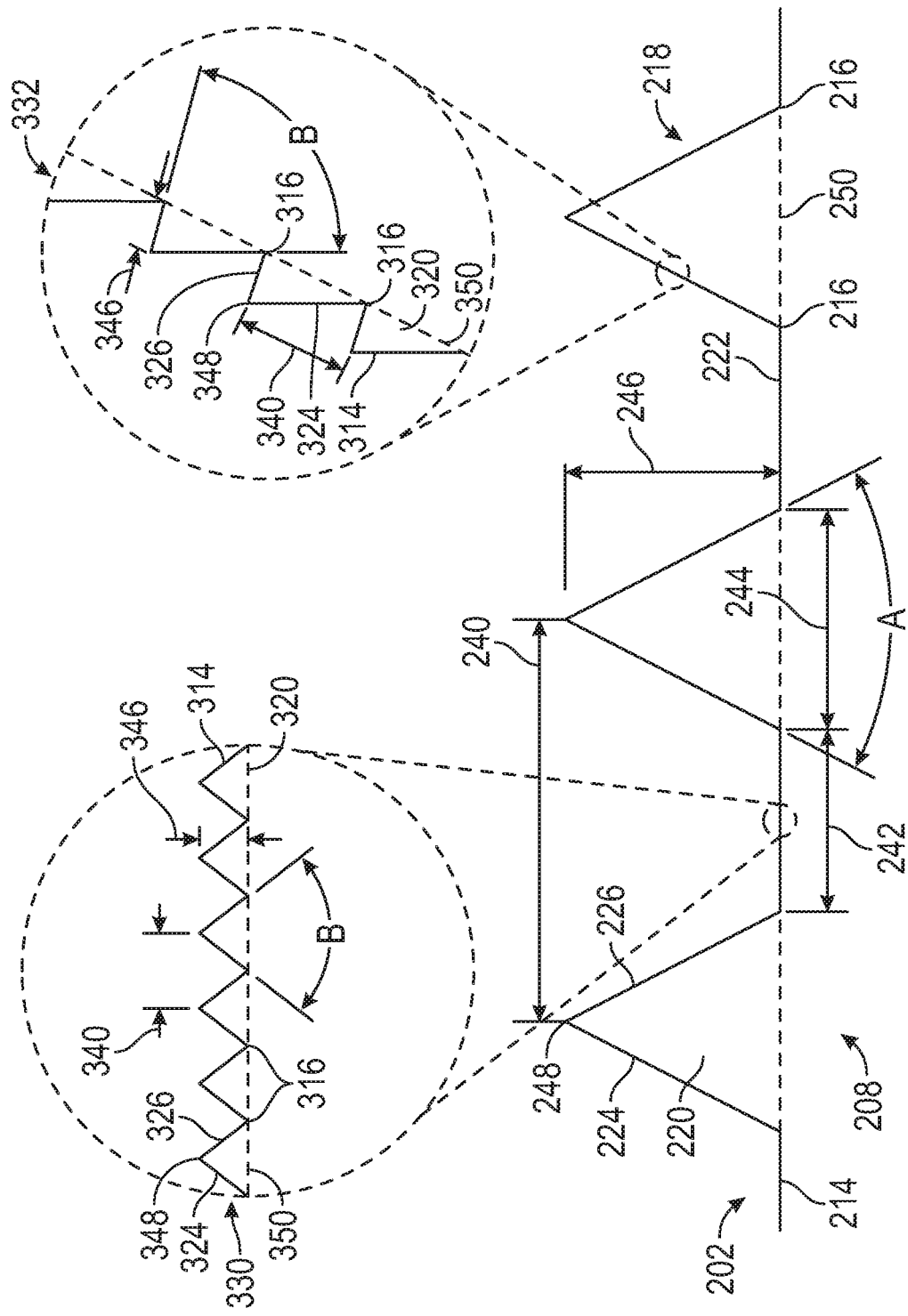
FIG. 3 is a cross-sectional illustration of various nano-structures of the anti-reflective surface structure of FIGS. 2A-2C in an xz-plane.

FIG. 3 shows anti-reflective surface 202 of layer 208 with nano-structures 330, 332, which are visible in two magnified overlays. At least one micro-peak 220 may include at least one first micro-segment 224 or at least one second micro-segment 226. Micro-segments 224, 226 may be disposed on opposite sides of apex 248 of micro-peak 220. Apex 248 may be, for example, the highest point or local maxima of line 214. Each micro-segment 224, 226 may include at least one: straight segment or curved segment.

Line 214 defining first and second micro-segments 224, 226 may have a first average slope and a second average slope, respectively. The slopes may be defined relative to baseline 250 as an x-axis (run), wherein an orthogonal direction is the z-axis (rise).

As used herein, the term "average slope" refers to an average slope throughout a particular portion of a line. In some embodiments, the average slope of first micro-segment 224 may refer to the slope between the endpoints of the first micro-segment. In some embodiments, the average slope of first micro-segment 224 may refer to an average value calculated from the slopes measured at multiple points along the first micro-segment.

In general, the micro-peak first average slope may be defined as positive and the micro-peak second average slope may be defined as negative. In other words, the first average slope and the second average slope have opposite signs. In some embodiments, the absolute value of the micro-peak first average slope may be equal to the absolute value of the micro-peak second average slope. In some embodiments, the absolute values may be different. In some embodiments, the absolute value of each average slope of micro-segments 224, 226 may be greater than the absolute value of the average slope of micro-space 222.

Angle A of micro-peaks 220 may be defined between the micro-peak first and second average slopes. In other words, the first and second average slopes may be calculated and then an angle between those calculated lines may be determined. For purposes of illustration, angle A is shown as relating to first and second micro-segments 224, 226. In some embodiments, however, when the first and second micro-segments are not straight lines, the angle A may not necessarily be equal to the angle between two micro-segments 224, 226.

Angle A may be in a range to provide sufficient anti-reflective properties for surface 202. In some embodiments, angle A may be at most 120 (in some embodiments, at most 110, 100, 95, 90, 85, 80, 75, 70, 65, 60, 55, 50, 45, 40, 35, 30, 25, 20, or even at most 10) degrees. In some embodiments, angle A is at most 85 (in some embodiments, at most 75) degrees. In some embodiments, angle A is, at the low end, at least 30 (in some embodiments, at least 25, 40, 45, or even at least 50) degrees. In some embodiments, angle A is, at the high end, at most 75 (in some embodiments, at most 60, or even at most 55) degrees.

Micro-peaks 220 may be any suitable shape capable of providing angle A based on the average slopes of micro-segments 224, 226. In some embodiments, micro-peaks 220 are generally formed in the shape of a triangle. In some embodiments, micro-peaks 220 are not in the shape of a triangle. The shape may be symmetrical across a z-axis intersecting apex 248. In some embodiments, the shape may be asymmetrical.

Each micro-space 222 may define micro-space width 242. Micro-space width 242 may be defined as a distance between corresponding boundaries 216, which may be between adjacent micro-peaks 220.

A minimum for micro-space width 242 may be defined in terms of micrometers. In some embodiments, micro-space width 242 may be at least 10 (in some embodiments, at least 20, 25, 30, 40, 50, 60, 70, 75, 80, 90, 100, 150, 200, or even at least 250) micrometers. In some applications, micro-space width 242 is, at the low end, at least 50 (in some embodiments, at least 60) micrometers. In some applications, micro-space width 242 is, at the high end, at most 90 (in some embodiments, at most 80) micrometers. In some applications, micro-space width 242 is 70 micrometers.

As used herein, the term "peak distance" refers to the distance between consecutive peaks, or between the closest pair of peaks, measured at each apex or highest point of the peak.

Micro-space width 242 may also be defined relative to micro-peak distance 240. In particular, a minimum for micro-space width 242 may be defined relative to corresponding micro-peak distance 240, which may refer to the distance between the closest pair of micro-peaks 220 surrounding micro-space 222 measured at each apex 248 of the micro-peaks. In some embodiments, micro-space width 242 may be at least 10% (in some embodiments, at least 20%, 25%, 30%, 40%, 50%, 60%, 70%, 80%, or even at least 90%) of the maximum for micro-peak distance 240. In some embodiments, the minimum for micro-space width 242 is, at the low end, at least 30% (in some embodiments, at least 40%) of the maximum for micro-peak distance 240. In some embodiments, the minimum for micro-space width 242 is, at the high end, at most 60% (in some embodiments, at most 50%) of the maximum for micro-peak distance 240. In some embodiments, micro-space width 242 is 45% of micro-peak distance 240.

A minimum the micro-peak distance 240 may be defined in terms of micrometers. In some embodiments, micro-peak distance 240 may be at least 1 (in some embodiments, at least 2, 3, 4, 5, 10, 25, 50, 75, 100, 150, 200, 250, or even at least 500) micrometers. In some embodiments, micro-peak distance 240 is at least 100 micrometers.

A maximum for micro-peak distance 240 may be defined in terms of micrometers. Micro-peak distance 240 may be at most 1000 (in some embodiments, at most 900, 800, 700, 600, 500, 400, 300, 250, 200, 150, 100, or even at most 50) micrometers. In some embodiments, micro-peak distance 240 is, at the high end, at most 200 micrometers. In some embodiments, micro-peak distance 240 is, at the low end, at least 100 micrometers. In some embodiments, micro-peak distance 240 is 150 micrometers.

Each micro-peak 220 may define micro-peak height 246. Micro-peak height 246 may be defined as a distance between baseline 350 and apex 248 of micro-peak 220. A minimum may be defined for micro-peak height 246 in terms of micrometers. In some embodiments, micro-peak height 246 may be at least 10 (in some embodiments, at least 20, 25, 30, 40, 50, 60, 70, 80, 90, 100, 150, 200, or even at least 250) micrometers. In some embodiments, micro-peak height 246 is at least 60 (in some embodiments, at least 70) micrometers. In some embodiments, micro-peak height 246 is 80 micrometers.

Plurality of nano-structures 330, 332 may be defined at least partially by line 214. Plurality of nano-structures 330 may be disposed on at least one or micro-space 222. In particular, line 314 defining nano-structures 330 may include at least one series of nano-peaks 320 disposed on at least one micro-space 222. In some embodiments, at least one series of nano-peaks 320 of plurality of nano-structures 332 may also be disposed on at least one micro-peak 220.

Due to at least their difference in size, micro-structures 218 may be more durable than nano-structures 330, 332 in terms of abrasion resistance. In some embodiments, plurality of nano-structures 332 are disposed only on micro-spaces 222 or at least not disposed proximate to or adjacent to apex 248 of micro-peaks 220.

Each nano-peak 320 may include at least one of first nano-segment 324 and second nano-segment 326. Each nano-peak 320 may include both nano-segments 324, 326. Nano-segments 324, 326 may be disposed on opposite sides of apex 348 of nano-peak 320.

First and second nano-segments 324, 326 may define a first average slope and a second average slope, respectively, which describe line 314 defining the nano-segment. For nano-structures 330, 332, the slope of line 314 may be defined relative to baseline 350 as an x-axis (run), wherein an orthogonal direction is the z-axis (rise).

In general, the nano-peak first average slope may be defined as positive and the nano-peak second average slope may be defined as negative, or vice versa. In other words, the first average slope and the second average slope at least have opposite signs. In some embodiments, the absolute value of the nano-peak first average slope may be equal to the absolute value of the nano-peak second average slope (e.g., nano-structures 330). In some embodiments, the absolute values may be different (e.g., nano-structures 332).

Angle B of nano-peaks 320 may be defined between lines defined by the nano-peak first and second average slopes. Similar to angle A, angle B as shown is for purposes of illustration and may not necessarily equal to any directly measured angle between nano-segments 324, 326.

Angle B may be a range to provide sufficient anti-reflective properties for surface 202. In some embodiments, angle B may be at most 120 (in some embodiments, at most 110, 100, 90, 85, 80, 75, 70, 65, 60, 55, 50, 45, 40, 35, 30, 25, 20, or even at most 10) degrees. In some embodiments, angle B is, at the high end, at most 85 (in some embodiments, at most 80, or even at most 75) degrees. In some embodiments, angle B is, at the low end, at least 55 (in some embodiments, at least 60, or even at least 65) degrees. In some embodiments, angle B is 70 degrees.

Angle B may be the same or different for each nano-peak 320. For example, in some embodiments, angle B for nano-peaks 320 on micro-peaks 220 may be different than angle B for nano-peaks 320 on micro-spaces 222.

Nano-peaks 320 may be any suitable shape capable of providing angle B based on lines defined by the average slopes of nano-segments 324, 326. In some embodiments, nano-peaks 320 are generally formed in the shape of a triangle. In at least one embodiments, nano-peaks 320 are not in the shape of a triangle. The shape may be symmetrical across apex 348. For example, nano-peaks 320 of nano-structures 330 disposed on micro-spaces 222 may be symmetrical. In at least one embodiments, the shape may be asymmetrical. For example, nano-peaks 320 of nano-structures 332 disposed on micro-peaks 220 may be asymmetrical with one nano-segment 324 being longer than other nano-segment 326. In some embodiments, nano-peaks 320 may be formed with no undercutting.

Each nano-peak 320 may define nano-peak height 346. Nano-peak height 346 may be defined as a distance between baseline 350 and apex 348 of nano-peak 320. A minimum may be defined for nano-peak height 346 in terms of nanometers. In some embodiments, nano-peak height 346 may be at least 10 (in some embodiments, at least 50, 75, 100, 120, 140, 150, 160, 180, 200, 250, or even at least 500) nanometers.

In some embodiments, nano-peak height 346 is at most 250 (in some embodiments, at most 200) nanometers, particularly for nano-structures 330 on micro-spaces 222. In some embodiments, nano-peak height 346 is in a range from 100 to 250 (in some embodiments, 160 to 200) nanometers. In some embodiments, nano-peak height 346 is 180 nanometers.

In some embodiments, nano-peak height 346 is at most 160 (in some embodiments, at most 140) nanometers, particularly for nano-structures 332 on micro-peaks 220. In some embodiments, nano-peak height 346 is in a range from 75 to 160 (in some embodiments, 100 to 140) nanometers. In some embodiments, nano-peak height 346 is 120 nanometers.

As used herein, the terms "corresponding micro-peak" or "corresponding micro-peaks" refer to micro-peak 220 upon which nano-peak 320 is disposed or, if the nano-peak is disposed on corresponding micro-space 222, refers to one or both of the closest micro-peaks that surround that micro-space. In other words, micro-peaks 220 that correspond to micro-space 222 refer to the micro-peaks in the series of micro-peaks that precede and succeed the micro-space.

Nano-peak height 346 may also be defined relative to micro-peak height 246 of corresponding micro-peak 220. In some embodiments, corresponding micro-peak height 246 may be at least 10 (in some embodiments, at least 50, 100, 150, 200, 300, 400, 500, 600, 700, 800, 900, or even at least 1000) times nano-peak height 346. In some embodiments, corresponding micro-peak height 246 is, at the low end, at least 300 (in some embodiments, at least 400, 500, or even at least 600) times nano-peak height 346. In some embodiments, corresponding micro-peak height 246 is, at the high end, at most 900 (in some embodiments, at most 800, or even at most 700) times nano-peak height 346.

Nano-peak distance 340 may be defined between nano-peaks 320. A maximum for nano-peak distance 340 may be defined. In some embodiments, nano-peak distance 340 may be at most 1000 (in some embodiments, at most 750, 700, 600, 500, 400, 300, 250, 200, 150, or even at most 100) nanometers. In some embodiments, nano-peak distance 340 is at most 400 (in some embodiments, at most 300) nanometers.

A minimum for the nano-peak distance 340 may be defined. In some embodiments, nano-peak distance 340 may be at least 1 (in some embodiments, at least 5, 10, 25, 50, 75, 100, 150, 200, 250, 300, 350, 400, 450, or even at least 500) nanometers. In some embodiments, nano-peak distance 340 is at least 150 (in some embodiments, at least 200) nanometers.

In some embodiments, the nano-peak distance 340 is in a range from 150 to 400 (in some embodiments, 200 to 300) nanometers. In some embodiments, the nano-peak distance 340 is 250 nanometers.

Nano-peak distance 340 may be defined relative to the micro-peak distance 240 between corresponding micro-peaks 220. In some embodiments, corresponding micro-peak distance 240 is at least 10 (in some embodiments, at least 50, 100, 200, 300, 400, 500, 600, 700, 800, 900, or even at least 1000) times nano-peak distance 340. In some embodiments, corresponding micro-peak distance 240 is, at the low end, at least 200 (in some embodiments, at least 300) times nano-peak distance 340. In some embodiments, corresponding micro-peak distance 240 is, at the high end, at most 500 (in some embodiments, at most 400) times the nano-peak distance 340.

In some embodiments of forming anti-reflective surface 202 of layer 208, a method may include extruding a hot melt material having a UV-stable material. The extruded material may be shaped with a micro-replication tool. The micro-replication tool may include a mirror image of a series of micro-structures, which may form the series of micro-structures on the surface of the layer 208. The series of micro-structures may include a series of alternating micro-peaks and micro-spaces along an axis. A plurality of nano-structures may be formed on the surface of the layer on at least the micro-spaces. The plurality of nano-peaks may include at least one series of nano-peaks along the axis.

In some embodiments, the plurality nano-structures may be formed by exposing the surface to reactive ion etching. For example, masking elements may be used to define the nano-peaks.

In some embodiments, the plurality of nano-structures may be formed by shaping the extruded material with the micro-replication tool further having an ion-etched diamond. This method may involve providing a diamond tool wherein at least a portion of the tool comprises a plurality of tips, wherein the pitch of the tips may be less than 1 micrometer, and cutting a substrate with the diamond tool, wherein the diamond tool may be moved in and out along a direction at a pitch ($p_1$). The diamond tool may have a maximum cutter width ($p_2$) and $p_1/p_2 \geq 2$.

The nano-structures may be characterized as being embedded within the micro-structured surface of the layer 208. Except for the portion of the nano-structure exposed to air, the shape of the nano-structure may generally be defined by the adjacent micro-structured material.

A micro-structured surface layer including nano-structures can be formed by use of a multi-tipped diamond tool. Diamond Turning Machines (DTM) can be used to generate micro-replication tools for creating anti-reflective surface structures including nano-structures as described in U.S. Pat. Pub. No. 2013/0236697 (Walker et al.) A micro-structured surface further comprising nano-structures can be formed by use of a multi-tipped diamond tool, which may have a single radius, wherein the plurality of tips has a pitch of less than 1 micrometer. Such multi-tipped diamond tool may also be referred to as a "nano-structured diamond tool." Hence, a micro-structured surface wherein the micro-structures further comprise nano-structures can be concurrently formed during diamond tooling fabrication of the micro-structured tool. Focused ion beam milling processes can be used to form the tips and may also be used to form the valley of the diamond tool. For example, focused ion beam milling can be used to ensure that inner surfaces of the tips meet along a common axis to form a bottom of valley. Focused ion beam milling can be used to form features in the valley, such as concave or convex arc ellipses, parabolas, mathematically defined surface patterns, or random or pseudo-random patterns. A wide variety of other shapes of valley could also be formed. Exemplary diamond turning machines and methods for creating discontinuous, or non-uniform, surface structures can include and utilize a fast tool servo (FTS) as described in, for example, PCT Pub. No. WO 00/48037, published Aug. 17, 2000; U.S. Pat. No. 7,350,442 (Ehnes et al.) and U.S. Pat. No. 7,328,638 (Gardiner et al.); and U.S. Pat. Pub. No. 2009/0147361 (Gardiner et al.), each of which are incorporated entirely herein by reference.

In some embodiments, the plurality of nano-structures may be formed by shaping the extruded material, or layer 208, with the micro-replication tool further having a nano-structured granular plating for embossing. Electrodeposition, or more specifically electrochemical deposition, can also be used to generate various surface structures including nano-structures to form a micro-replication tool. The tool may be made using a 2-part electroplating process, wherein a first electroplating procedure may form a first metal layer with a first major surface, and a second electroplating procedure may form a second metal layer on the first metal layer. The second metal layer may have a second major surface with a smaller average roughness than that of the first major surface. The second major surface can function as the structured surface of the tool. A replica of this surface can then be made in a major surface of an optical film to provide light diffusing properties. One example of an electrochemical deposition technique is described in U.S. Pat. Appl. Having U.S. Ser. No. 62/446,821, PCT Pub. No. WO 2018/130926, published Jul. 19, 2018 (Derks et al.), filed 16 Jan. 2017, entitled "Faceted Micro-structured Surface," the disclosures of which are incorporated entirely herein by reference.

Figure 4:
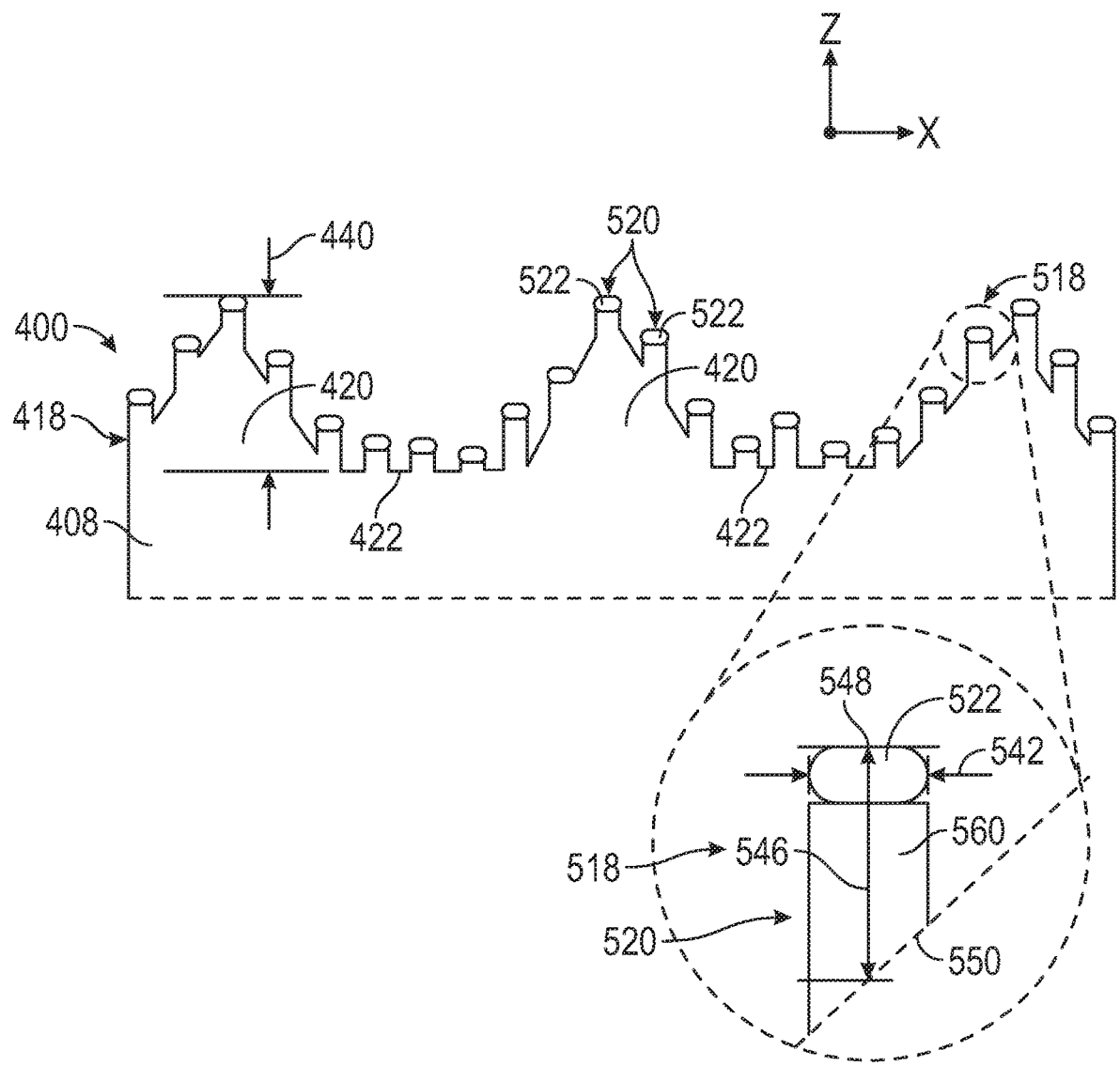
FIG. 4 is a cross-sectional illustration of various nano-structures including masking elements in an xz-plane as an alternative to the nano-structures of FIG. 3 that maybe used with the anti-reflective surface structure of FIGS. 2A-2C.

FIG. 4 shows cross section 400 of layer 408 having anti-reflective surface 402. Anti-reflective surface 402 may be similar to anti-reflective surface 202, for example, in that micro-structures 218, 418 of layer 208, 408 may have the same or similar dimensions and may also form a skipped tooth riblet pattern of alternating micro-peaks 420 and micro-spaces 422. Anti-reflective surface 402 differs from surface 202 in that, for example, nano-structures 520 may include nano-sized masking elements 522.

Nano-structures 520 may be formed using masking elements 522. For example, masking elements 522 may be used in a subtractive manufacturing process, such as reactive ion etching (RIE), to form nano-structures 520 of surface 402 having micro-structures 418. A method of making a nano-structure and nano-structured articles may involve depositing a layer to a major surface of a substrate, such as layer 408, by plasma chemical vapor deposition from a gaseous mixture while substantially simultaneously etching the surface with a reactive species. The method may include providing a substrate, mixing a first gaseous species capable of depositing a layer onto the substrate when formed into a plasma, with a second gaseous species capable of etching the substrate when formed into a plasma, thereby forming a gaseous mixture. The method may include forming the gaseous mixture into a plasma and exposing a surface of the substrate to the plasma, wherein the surface may be etched, and a layer may be deposited on at least a portion of the etched surface substantially simultaneously, thereby forming the nano-structure.

The substrate can be a (co)polymeric material, an inorganic material, an alloy, a solid solution, or a combination thereof. The deposited layer can include the reaction product of plasma chemical vapor deposition using a reactant gas comprising a compound selected from the group consisting of organosilicon compounds, metal alkyl compounds, metal isopropoxide compounds, metal acetylacetonate compounds, metal halide compounds, and combinations thereof. Nano-structures of high aspect ratio, and optionally with random dimensions in at least one dimension, and even in three orthogonal dimensions, can be prepared.

In some embodiments of a method of forming anti-reflective surface 402, layer 408 having a series of micro-structures 418 disposed on surface 402 of the layer may be provided. The series of micro-structures 418 may include a series of alternating micro-peaks 420 and micro-spaces 422.

A series of nano-sized masking elements 522 may be disposed on at least micro-spaces 422. Surface 402 of layer 408 may be exposed to reactive ion etching to form plurality of nano-structures 518 on the surface of the layer including series of nano-peaks 520. Each nano-peak 520 may include masking element 522 and column 560 of layer material between masking element 522 and layer 408.

Masking element 522 may be formed of any suitable material more resistant to the effects of RIE than the material of layer 408. In some embodiments, masking element 522 includes an inorganic material. Non-limiting examples of inorganic materials include silica and silicon dioxide. In some embodiments, the masking element 522 is hydrophilic. Non-limiting examples of hydrophilic materials include silica and silicon dioxide.

As used herein, the term "maximum diameter" refers to a longest dimension based on a straight line passing through an element having any shape.

Masking elements 522 may be nano-sized. Each masking element 522 may define maximum diameter 542. In some embodiments, the maximum diameter of masking element 522 may be at most 1000 (in some embodiments, at most 750, 500, 400, 300, 250, 200, 150, or even at most 100) nanometers.

Maximum diameter 542 of each masking element 522 may be described relative to micro-peak height 440 of corresponding micro-peak 420. In some embodiments, corresponding micro-peak height 440 is at least 10 (in some embodiments, at least 25, 50, 100, 200, 250, 300, 400, 500, 750, or even at least 1000) times maximum diameter 542 of masking element 522.

Each nano-peak 520 may define height 522. Height 522 may be defined between baseline 550 and the apex 548 of masking element 522.

Figure 5A:
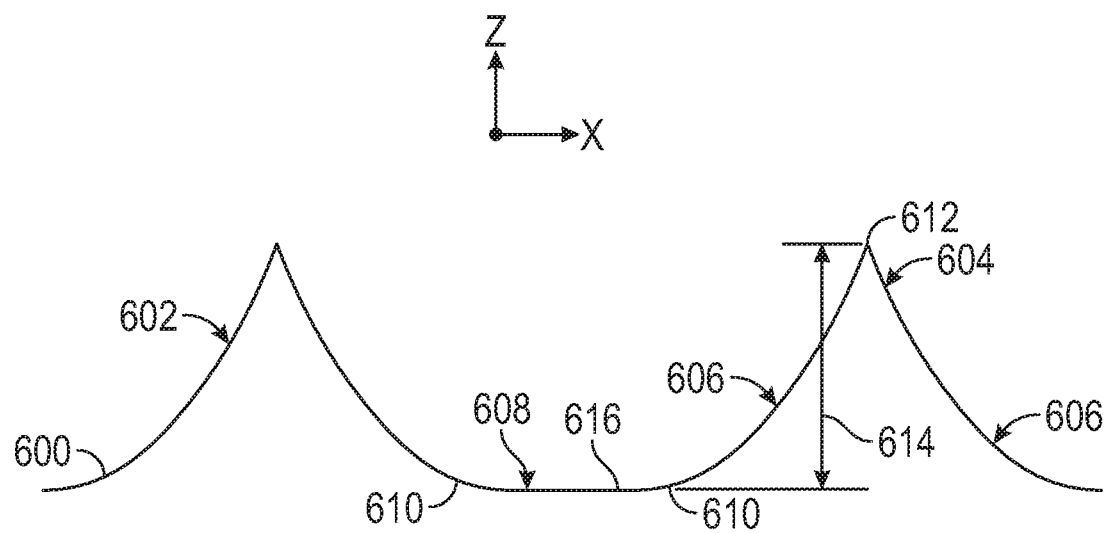
FIGS. 5A and 5B show illustrations of lines representing the cross-sectional profile of different forms of micro-structures for an anti-reflective surface structure in an xz-plane.
Figure 5B:
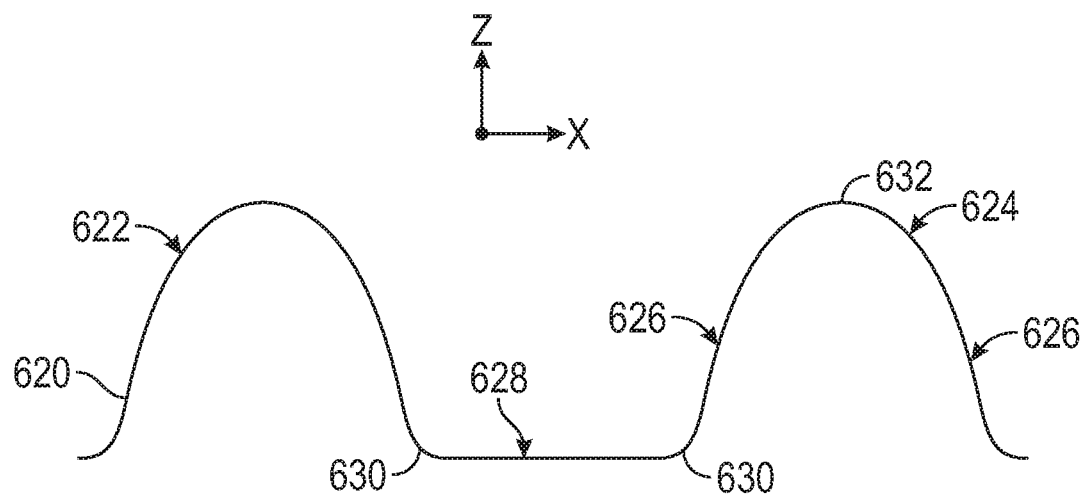

FIGS. 5A and 5B show lines 600 and 620 representing the cross-sectional profile of different forms of peaks 602, 622, which may be micro-peaks of micro-structures or nano-peaks of nano-structures, for any of the anti-reflective surfaces, such as surfaces 202, 402. As mentioned, structures do not need to be strictly in the shape of a triangle.

Line 600 shows that first portion 604 (top portion) of peak 602, including apex 612, may have a generally triangular shape, whereas adjacent side portions 606 may be curved. In some embodiments, as illustrated, side portions 606 of peak 602 may not have a sharper turn as it transitions into space 608. Boundary 610 between side portion 606 of peak 602 and space 608 may be defined by a threshold slope of line 600 as discussed herein, for example, with respect to FIGS. 2A-2C and 3.

Space 608 may also be defined in terms of height relative to height 614 of peak 602. Height 614 of peak 602 may be defined between one of boundaries 610 and apex 612. Height of space 608 may be defined between bottom 616, or lowest point of space 608, and one of boundaries 610. In some embodiments, the height of space 608 may be at most 40% (in some embodiments, at most 30%, 25%, 20%, 15%, 10%, 5%, 4%, 3%, or even at most 2%) of height 614 of peak 602. In some embodiments, the height of space 608 is at most 10% (in some embodiments, at most 5%, 4%, 3%, or even at most 2%) of height 614 of peak 602.

Line 620 shows that first portion 624 (top portion) of peak 620, including the apex, may have a generally rounded shape without a sharp turn between adjacent side portions 626. Apex 632 may be defined as the highest point of structure 620, for example, where the slope changes from positive to negative. Although first portion 624 (top portion) may be rounded at apex 632, peak 620 may still define an angle, such as angle A (see FIG. 3), between first and second average slopes.

Boundary 630 between side portion 626 of peak 620 and space 628 may be defined, for example, by a sharper turn. Boundary 630 may also be defined by slope or relative height, as discussed herein.

As shown in FIGS. 10 to 13, the anti-reflective surface may be discontinuous, intermittent, or non-uniform. For example, the anti-reflective surface may also be described as including micro-pyramids with micro-spaces surrounding the micro-pyramids (see FIGS. 12 and 13).

Figure 10:
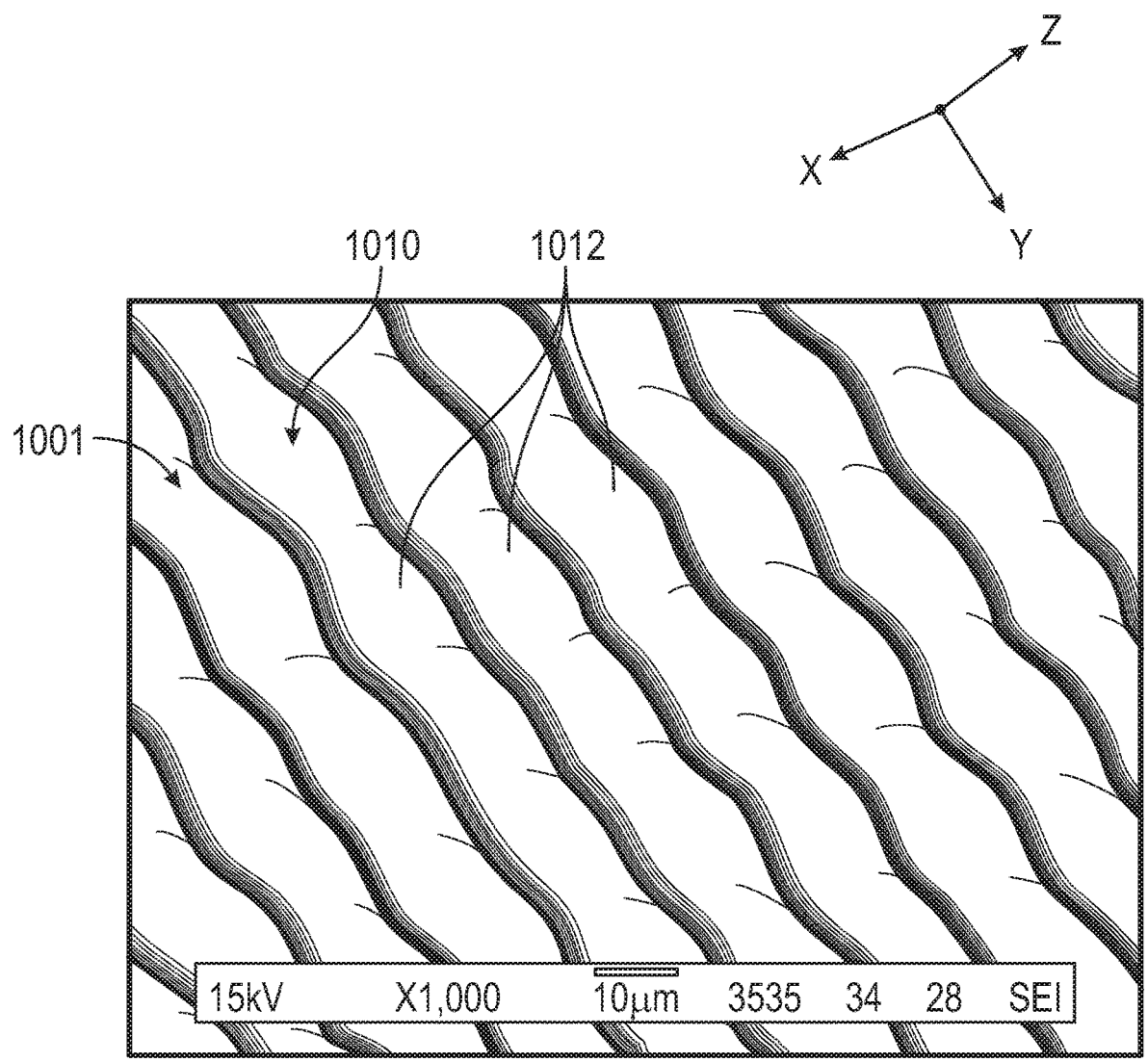
FIG. 10 is a perspective illustration of a portion of a first anti-reflective surface structure with discontinuous micro-structures.

FIG. 10 shows first anti-reflective surface 1001 defined at least partially by non-uniform micro-structures 1010. For example, if anti-reflective surface 1001 were viewed in the yz-plane (similar to FIG. 2B), at least one micro-peak 1012 may have a non-uniform height from the left side to the right side of the view, which can be contrasted to FIG. 2B showing micro-peak 220 having a uniform height from the left side to the right side of the view. In particular, micro-peaks 1012 defined by the micro-structures 1010 may be non-uniform in at least one of height or shape. The micro-peaks 1012 are spaced by micro-spaces (not shown in this perspective view), similar to other surfaces described herein, such as micro-space 222 of surface 202 (FIGS. 2A and 2C).

Figure 11:
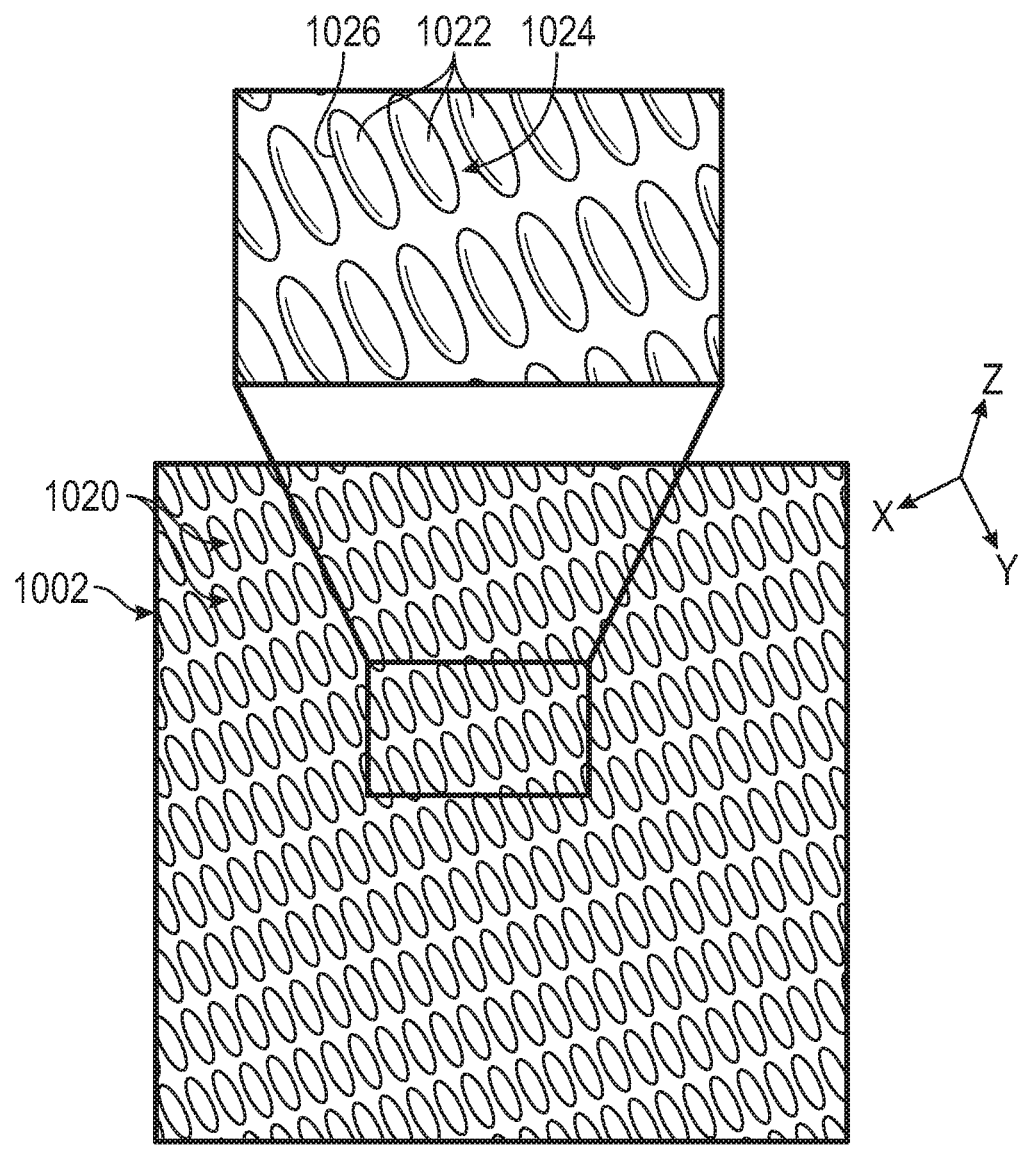
FIG. 11 is a perspective illustration of a portion of a second anti-reflective surface structure with discontinuous micro-structures.

FIG. 11 shows second anti-reflective surface 1002 with discontinuous micro-structures 1020. For example, if anti-reflective surface 1002 were viewed on the yz-plane (similar to FIG. 2B), more than one micro-peak 1022 may be shown spaced by micro-structures 1020, which can be contrasted to FIG. 2B showing micro-peak 220 extending continuously from the left side to the right side of the view. In particular, micro-peaks 1022 of micro-structures 1020 may be surrounded by micro-spaces 1024. Micro-peaks 1022 may each have a half dome-like shape. For example, the half dome-like shape may be a hemisphere, a half ovoid, a half-prolate spheroid, or a half-oblate spheroid. Edge 1026 of the base of each micro-peak 1022, extending around each micro-peak, may be a rounded shape (e.g., a circle, an oval, or a rounded rectangle). The shape of the micro-peaks 1022 may be uniform, as depicted in the illustrated embodiment, or can be non-uniform.

Figure 12:
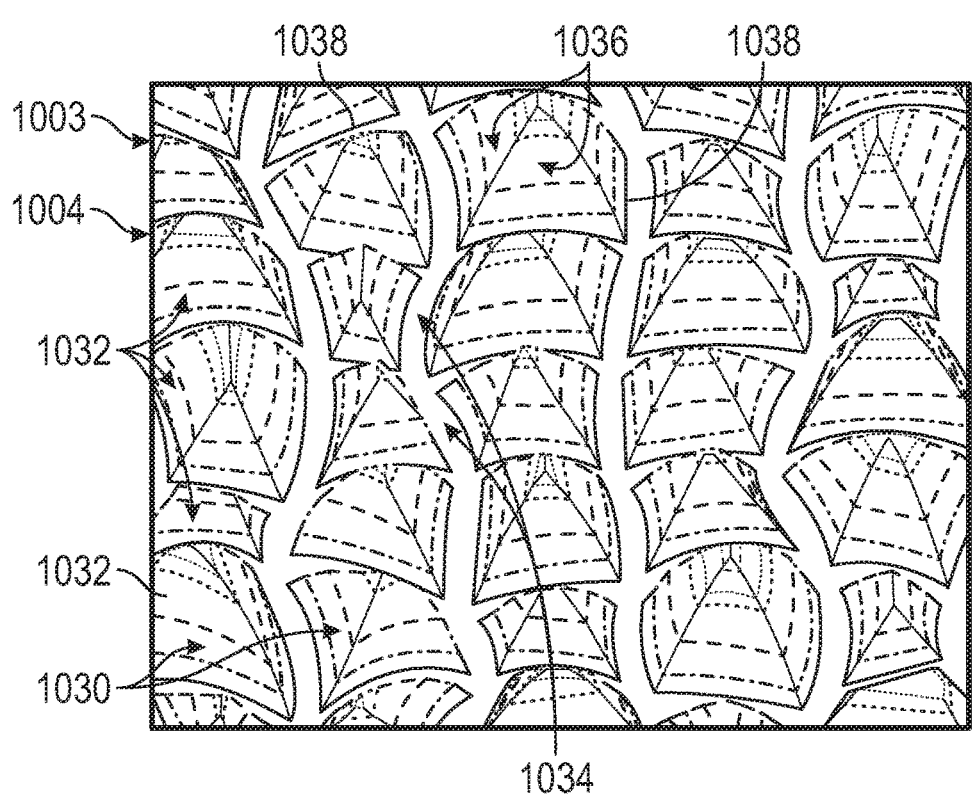
FIGS. 12 and 13 are perspective illustrations of different portions of a third anti-reflective surface structure with discontinuous micro-structures.
Figure 13:
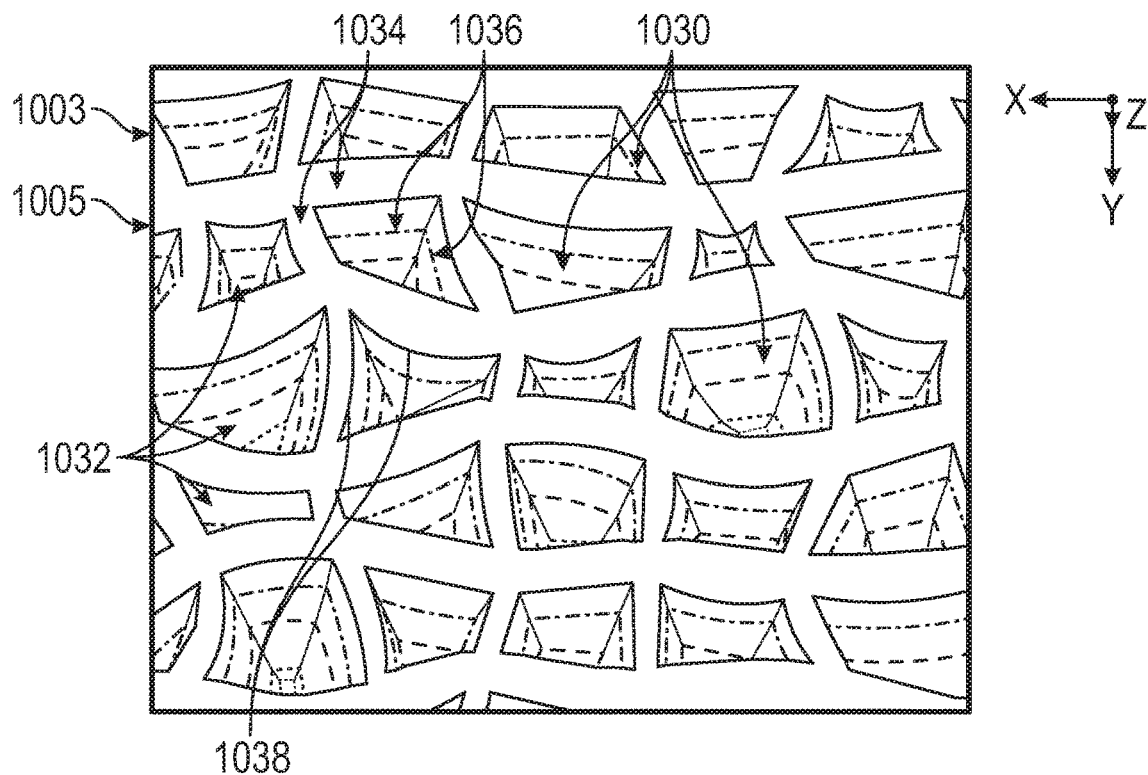

FIGS. 12 and 13 are perspective illustrations of first portion 1004 (FIG. 12) and second portion 1005 (FIG. 13) of third anti-reflective surface 1003 with discontinuous micro-structures 1030. Both are perspective views. The FIG. 12 view shows more of a "front" side of the micro-structures 1030 close to a 45-degree angle, whereas the FIG. 13 view shows some of a "back" side of the micro-structures closer to an overhead angle.

Micro-peaks 1032 of micro-structures 1030 surrounded by micro-spaces 1034 may have a pyramid-like shape (e.g., micro-pyramids). For example, the pyramid-like shape may be a rectangular pyramid or a triangular pyramid. Sides 1036 of the pyramid-like shape may be non-uniform in shape or area, as depicted in the illustrated embodiment, or can be uniform in shape or area. Edges 1038 of the pyramid-like shape may be non-linear, as depicted in the illustrated embodiment, or can be linear. The overall volume of each micro-peak 1032 may be non-uniform, as depicted in the illustrated embodiment, or can be uniform.

Figure 15:
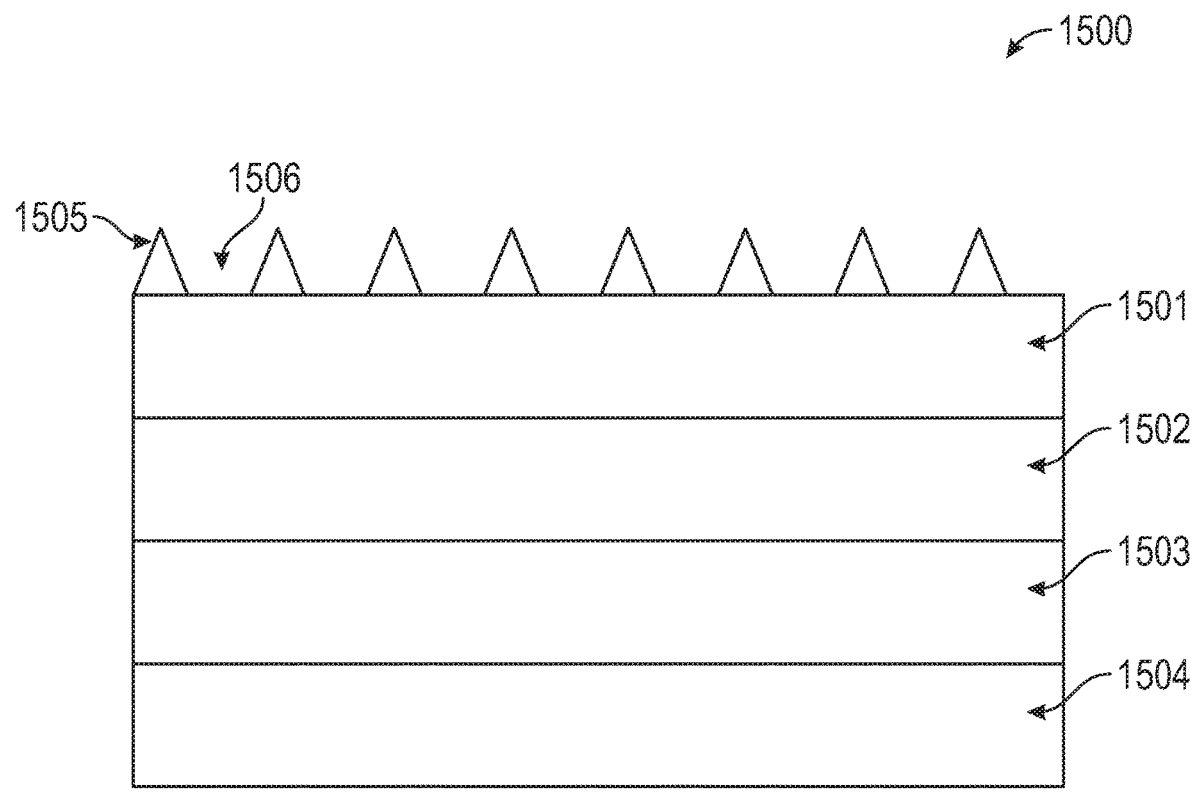
FIG. 15 is a cross-sectional illustration of another embodiment of an anti-reflective surface structure with skipped tooth micro-structures and nano-structures on a multi-layer film substrate.

FIG. 15 shows a multi-layer film having skipped tooth micro-structures 1505 with micro-spaces 1506 and nano-structures on the micro-spaces. Multi-layer films can be advantageous for having physical and chemical properties on the top surface of the film that differ from the physical and chemical properties on the bottom surface of the film.

For example, highly fluorinated polymers are beneficial for stain, chemical, and dirt resistance, but inherently do not adhere well to other polymers or adhesives. A first fluoropolymer layer 1501 having a high content of tetra-fluoroethylene (TFE) have higher fluorine content and thus can be beneficial as the micro-structured surface layer in articles described herein. The second fluoropolymer layer 1502 may have a lower content of TFE and still adhere well to the first fluoropolymer layer 1501. If the second fluoropolymer layer also comprises vinylidene fluoride (VDF), it will adhere well to other fluoropolymers comprising VDF, such as polyvinylidene fluoride (PVDF). If the second, or third, fluoropolymer 1503 layer comprises enough VDF, it will adhere well to non-fluorinated polymer layer 1504 such as acrylate polymers and even urethane polymers. Useful multi-layer fluoropolymer films for anti-reflective surface structured films having highly fluorinated top surface layers and less fluorinated bottom surface layers are described in PCT Pub. No. WO2017/172564A2, published 5 Oct. 2017, which is incorporated entirely herein by reference.

In some embodiments, a multi-layer fluoropolymer film can be coextruded and simultaneously extrusion micro-replicated with a skipped tooth micro-structure have micro-spaces. For example, a first fluoropolymer under the trade designation "3M DYNEON THV815" available from 3M Company, can be coextruded as the first layer with a second fluoropolymer under trade designation "3M DYNEON THV221" available from 3M Company as the second layer, and a third fluoropolymer under the trade designation "3M DYNEON PVDF 6008" available from 3M Company as the third layer. Optionally, for example, a fourth layer of a PMMA under the trade designation "VO44" available from Arkema, Bristol, PA or of a CoPMMA under the trade designation "KURARITY LA4285" available from Kurary Ltd., Osaka, Japan, or a polymer blend thereof, can be coextruded with the three fluoropolymer layers. This multi-layer fluoropolymer coextrusion method may provide a top anti-reflective surface structured layer that is highly fluorinated and a bottom layer that has little, or no fluorine content.

UV stabilization with UV-absorbers (UVAs) and Hindered Amine Light Stabilizers (HALs) can intervene in the prevention of photo-oxidation degradation of PETs, PMMAs, and CoPMMAs. UVAs for incorporation into PET, PMMA, or CoPMMA optical layers include benzophenone, benzotriazoles, and benzothiazines. Exemplary UVAs for incorporation into PET, PMMA, or CoPMMA optical layers may be provided under the trade designation "TINUVIN 1577" or "TINUVIN 1600," either available from BASF Corporation, Florham Park, NJ. Typically, UVAs are incorporated in the polymer at a concentration of 1-10 wt. %. Exemplary HALs for incorporation into PET, PMMA, or CoPMMA optical layers may be provided under the trade designation "CHIMMASORB 944" or "TINUVIN 123," either available from BASF Corporation. Typically, HALs are incorporated into the polymer at a 0.1-1.0 wt. %. A 10:1 ratio of UVA to HALs may be used.

UVAs and HALs can also be incorporated into the fluoropolymer surface layer, or a fluoropolymer layer below the surface layer. U.S. Pat. No. 9,670,300 (Olson et al.) and U.S. Pat. Pub. No. 2017/0198129 (Olson et al.), which are incorporated entirely herein by reference, describe exemplary UVA oligomers compatible with fluoropolymers and fluoropolymer blends.

Other UV blocking additives may be included in the fluoropolymer surface layer. Small particle non-pigmentary zinc oxide and titanium oxide can also be used as UV blocking additives in the fluoropolymer surface layer. Nanoscale particles of zinc oxide and titanium oxide will reflect, or scatter, UV light while being transparent to Visible and near Infrared light. These small zinc oxide and titanium oxide particles in the size range of 10-100 nanometers that can reflect UV light are commercially available from Kobo Products Inc., South Plainfield, NJ.

Anti-stat additives may also be useful for incorporation into either the fluoropolymer surface layer or into the optical layers to reduce unwanted attraction of dust, dirt, and debris. Ionic anti-stats (e.g., under the trade designation "3M IONIC LIQUID ANTI-STAT FC-4400" or "3M IONIC LIQUID ANTI-STAT FC-5000" available from 3M Company) may be incorporated into PVDF fluoropolymer layers to provide static dissipation. Anti-stat additives for PMMA and CoPMMA optical polymer layers may be provided under the trade designation "STATRITE" available from Lubrizol Engineered Polymers, Brecksville, OH. Additional anti-stat additives for PMMA and CoPMMA optical polymer layers may be provided under the trade designation "PELESTAT" available from Sanyo Chemical Industries, Tokyo, Japan. Optionally, anti-stat properties can be provided with transparent conductive coatings, such as: indium tin oxide (ITO), fluorine doped tin oxide (FTO), aluminum doped zinc oxide (AZO), metallic nanowires, carbon nanotubes, or a thin layer of graphene, any of which may be disposed, or coated, onto one of the layers of the anti-reflective surface structured films described herein.

ILLUSTRATIVE EMBODIMENTS

With various aspects of the anti-reflective surface being described, various illustrative combinations are also described to further illustrate various combinations of micro-structures and nano-structures that are useful in certain applications, some of which are described herein. As used herein, "any X embodiment is included" refers to including any embodiment including the designation X (e.g., any A embodiment refers to any embodiment A, A1, A2, A5a, etc. and any A5 embodiment refers to any embodiment A5, A5a, A5b, etc.).

In illustrative embodiment A, an article includes a layer defining an anti-reflective surface extending along an axis. A plane containing the axis defines a cross section of the layer and intersects the surface to define a line describing a cross-sectional profile of the surface. The layer includes a series (i.e., elements arranged sequentially in at least one dimensions) of micro-structures (i.e., micro being in the range from 1 to 1000 micrometers in both height and width) at least partially defined by the line. The line defines a series of alternating micro-peaks and micro-spaces along the axis (in some embodiments, a micro-space between pairs of micro-peaks or vice versa; in some embodiments, at least one pair of micro-peaks may not include a micro-space in between). Each micro-space defines a maximum absolute slope defining an angle off the axis of at most 30 (in some embodiments, at most 25, 20, 15, 10, 5, 4, 3, 2, even at most 1) degrees. Each micro-peak includes a first micro-segment defining a first average slope and a second micro-segment defining a second average slope. An angle formed between the first and second average slopes is at most 120 (in some embodiments, at most 110, 100, 90, 80, 75, 70, 65, 60, 55, 50, 45, 40, 35, 30, 20, or even at most 10) degrees. The layer also includes a plurality of nano-structures (i.e., nano being less than 1 micrometer in both height and width) at least partially defined by the line. The line defines at least one series of nano-peaks disposed on at least the micro-spaces along the axis. Each nano-peak has a height (i.e., from a baseline of the nano-peak to the apex of the nano-peak) and each corresponding micro-peak has a height of at least 10 (in some embodiments, at least 25, 50, 75, 100, 200, 300, 400, 500, 600, 700, 800, 900, or even at least 1000) times the height of the nano-peak (i.e., nano-peaks on the micro-peak or a micro-space corresponding to the micro-peak).

In illustrative embodiment B, an article includes a layer defining an anti-reflective surface extending along an axis. A plane containing the axis defines a cross section of the layer and intersects the surface to define a line describing a cross-sectional profile of the surface. The layer includes a series of micro-structures at least partially defined by the line. The line defines a series of alternating micro-peaks and micro-spaces along the axis. A boundary between each adjacent micro-peak and micro-space includes at least one of a bend (i.e., a point at the sharpest curve compared to adjacent portions or a point of change in direction of a straight line) or an inflection point (e.g., a point of line in which the direction of curvature changes) of the line. The layer also includes a plurality of nano-structures at least partially defined by the line. The line defining at least one series of nano-peaks disposed on at least the micro-spaces along the axis. Each nano-peak has a height (i.e., from a baseline of the nano-peak to the apex of the nano-peak) and each corresponding micro-peak has a height of at least 10 (in some embodiments, at least 25, 50, 75, 100, 200, 300, 400, 500, 600, 700, 800, 900, or even at least 1000) times the height of the nano-peak (i.e., nano-peaks on the micro-peak or a micro-space corresponding to the micro-peak).

In illustrative embodiment A1, the article of any A embodiment is included, wherein the micro-peak first average slope is positive, and the micro-peak second average slope is negative.

In illustrative embodiment A2, the article of any A embodiment is included, wherein an absolute value of the micro-peak first average slope is equal to an absolute value of the micro-peak second average slope.

In illustrative embodiment A3, the article of any A or B embodiment is included, wherein a width of each micro-space is at least 10% (in some embodiments, at least 20%, 25%, 30%, 40%, 50%, 60%, 70%, 75%, 80%, or even at least 90%) of a corresponding micro-peak distance (i.e., distance between the closest pair of micro-peaks measured at each apex).

In illustrative embodiment A4, the article of any A or B embodiment is included, wherein the micro-spaces have a width of at least 10 (in some embodiments, at least 20, 25, 30, 40, 50, 60, 70, 75, 80, 90, 100, 125, 150, 200, or even at least 250) micrometers.

In illustrative embodiment A5, the article of any A or B embodiment is included, wherein a micro-peak distance between micro-peaks is at least 1 (in some embodiments, at least 2, 3, 4, 5, 10, 25, 50, 75, 100, 150, 200, 250, or even at least 500) micrometers.

In illustrative embodiment A6, the article of any A or B embodiment is included, wherein a micro-peak distance between micro-peaks is at most 1000 (in some embodiments, at most 900, 800, 700, 600, 500, 400, 300, 250, 200, 150, 100, or even at most 50) micrometers.

In illustrative embodiment A7, the article of any A or B embodiment is included, wherein the micro-peaks have a height of at least 10 (in some embodiments, at least 20, 30, 40, 50, 60, 70, 75, 80, 90, 100, 150, 200, or even at least 250) micrometers.

In illustrative embodiment A8, the article of any A or B embodiment is included, wherein each nano-peak includes a first nano-segment defining a first average slope and a second nano-segment defining a second average slope, wherein an angle formed between the nano-peak first average slope and the nano-peak second average slope is at most 120 (in some embodiments, at most 110, 100, 90, 80, 75, 70, 65, 60, 55, 50, 45, 40, 35, 30, 25, 20, or even at most 10) degrees.

In illustrative embodiment A8a, the article of embodiment A8 is included, wherein an absolute value of the nano-peak first average slope is different than an absolute value of the nano-peak second average slope.

In illustrative embodiment A9, the article of any A or B embodiment is included, wherein the plurality of nano-structures is further disposed on the micro-peaks.

In illustrative embodiment A10, the article of any A or B embodiment is included, wherein each nano-peak defines a nano-peak distance and the corresponding micro-peaks define a micro-peak distance of at least 10 (in some embodiments, at least 25, 50, 75, 100, 200, 300, 400, 500, 600, 700, 800, 900, or even at least 1000) times the nano-peak distance.

In illustrative embodiment A11, the article of any A or B embodiment is included, wherein a nano-peak distance between nano-peaks is at most 1 micrometer (in some embodiments, at most 750, 500, 400, 300, 250, 200, 150, or even at most 100, nanometers).

In illustrative embodiment A12, the article of any A or B embodiment is included, wherein a nano-peak distance between nano-peaks is at least 1 (in some embodiments, at least 2, 3, 4, 5, 10, 25, 50, 75, 100, 150, 200, 250, 300, 350, 400, 450, or even at least 500) nanometer.

In illustrative embodiment A13, the article of any A or B embodiment is included, wherein the layer defining the anti-reflective surface includes at least one of a fluoropolymer, a polyolefin polymer, or an ultraviolet stable material.

In illustrative embodiment A14, the article of any A or B embodiment is included, wherein the nano-peaks include at least one masking element (in some embodiments, the masking element includes an inorganic material).

In illustrative embodiment A14a, the article of embodiment A14 is included, wherein the masking element has a diameter of at most 1 micrometer (in some embodiments, at most 750, 500, 400, 300, 250, 200, 150, or even at most 100, nanometers).

In illustrative embodiment A14b, the article of any A14 embodiment is included, wherein the masking element is hydrophilic.

In illustrative embodiment A15, the article of any A embodiment is included, wherein the micro-peaks are non-uniform in at least one of height or shape.

In illustrative embodiment A16, the article of any A or B embodiment is included, further including an ultraviolet stable adhesive coupled to a side of the layer opposite to the anti-reflective surface.

In illustrative embodiment A16a, the article of embodiment A15 is included, wherein the UV stable adhesive is self-wetting to glass (i.e., can be laid down on glass without creating air bubbles).

In illustrative embodiment C, a method of forming an article having a layer defining an anti-reflective surface includes forming a series of micro-structures on a surface of a layer. The series of micro-structures including a series of alternating micro-peaks and micro-spaces along an axis. The method also includes disposing a series of nano-sized masking elements on at least the micro-spaces along the axis. The masking elements define a maximum diameter (i.e., longest dimension based on a straight line passing through the masking element of any suitable shape) and the corresponding micro-peaks have a height of at least 10 (in some embodiments, at least 25, 50, 75, 100, 200, 300, 400, 500, 750, or even at least 1000) times the maximum diameter of the masking elements. The method further includes exposing the surface of the layer to reactive ion etching to form a plurality of nano-structures on the surface of the layer including a series of nano-peaks along the axis. Each nano-peak includes the masking element and a column between the masking element and the layer.

In illustrative embodiment C1, the method of any C embodiment is included, further including disposing the series of masking elements on the micro-peaks.

In illustrative embodiment C2, the method of any C embodiment is included, wherein the maximum diameter of the masking elements is at most 1 micrometer (in some embodiments, at most 750, 500, 400, 300, 250, 200, 150, or even at most 100, nanometers).

In illustrative embodiment D, a method of forming an article having a layer defining an anti-reflective surface includes extruding a hot melt material having an ultraviolet-stable material. The method also includes shaping the extruded material with a micro-replication tool having a mirror image of a series of micro-structures to form the series of micro-structures on the surface of the layer. The series of micro-structures includes a series of alternating micro-peaks and micro-spaces along an axis. The method further includes forming a plurality of nano-structures on the surface of the layer on at least the micro-spaces. The plurality of nano-peaks includes at least one series of nano-peaks (e.g., along the axis).

In illustrative embodiment D1, the method of any D embodiment is included, wherein forming the plurality of nano-structures includes exposing the surface to reactive ion etching.

In illustrative embodiment D2, the method of any D embodiment is included, wherein forming the plurality of nano-structures includes shaping the extruded material with the micro-replication tool further having an ion-etched diamond.

In illustrative embodiment D3, the method of any D embodiment is included, wherein forming the plurality of nano-structures includes shaping the extruded material with the micro-replication tool further having a nano-structured granular plating.

EXAMPLES

While the present disclosure is not so limited, an appreciation of various aspects of the disclosure will be gained through a discussion of some specific examples.

Prototype Photovoltaic Modules

Photovoltaic modules used to make power measurements with front surface structured films in Examples 1-6 were made using a vacuum thermal laminator (obtained under the trade designation "MODULE LAMINATOR LM-110X160-S" available from NPC Incorporated, Tokyo, Japan). The photovoltaic modules were laminated into a sandwich construction with the following layer order from top to bottom: (1) Surface structured film, (2) Ethylene-vinyl acetate (EVA) encapsulant, (3) Solar Glass, (4) EVA encapsulant, (5) Photovoltaic cell string, (6) EVA encapsulant, (7) Fluoropolymer backsheet.

The surface structured film (1) was different for each Example 1-6 as described herein. The top layer of encapsulant (2) was obtained under the trade designation "3M SOLAR ENCAPSULANT FILM EVA9110T" from 3M Company, St. Paul, MN. The solar glass (3) was obtained under the trade designation "STARPHIRE GLASS" from Vitro Architectural Glass, Cheswick, PA. The next layer of encapsulant (4) was obtained under the trade designation "3M SOLAR ENCAPSULANT FILM EVA9110T." The photovoltaic cells (5) were p-type photovoltaic cells obtained from LUXOL Photovoltaics SAS, Chambery, France, and conductive tabbing ribbons were soldered to the photovoltaic cells and extended beyond the edge of the glass. The bottom layer of EVA encapsulant (6) was obtained under the trade designation "3M SOLAR ENCAPSULANT FILM EVA9120B" from 3M Company. The fluoropolymer backsheet (7) was obtained under the trade designation "3M SCOTCHSHIELD SF950" from 3M Company.

The above assembly was placed in the vacuum thermal laminator and heated for 5 minutes at 145° C. under 1.33 kPa of vacuum (10 mm Hg) and then heated for 13 minutes at 145° C. under 124.1 kPa of pressure (18 psi).

Dirt Testing Method

Dirt testing on the prototype photovoltaic modules was performed by first measuring initial power output tests on each photovoltaic module prior to exposure to dirt using a flash tester obtained under the trade designation "SPI-SUN SIMULATOR 3500SLP" from Spire Solar, LLC, Tyngsboro, MA. Power measurements were made with the PV modules horizontal (0-degree angle), tilted at 45 degrees from horizontal, and tilted at 60 degrees from horizontal. The measured increase in power % over the control PV module is shown in FIGS. 6-7.

Each PV module was then placed in a pan sized 5.1 cm×30.5 cm×30.5 cm (2 inches×12 inches×12 inches). ASTM Arizona Test Dust was obtained under the trade designation "ARIZONA TEST DUST 0-70 MICRON" from Powder Technology Inc., Arden Hills, MN. Onto the PV module, 100 grams of the ASTM Arizona Test Dust was poured, and then the pan was shaken until the PV module was evenly covered with the ASTM Arizona Test Dust. The PV modules were then removed from the pan, turned upside down, and shaken to remove loosely bonded ASTM Arizona Test Dust. Power measurements were repeated on each of the PV modules that had been exposed to the ASTM Arizona TEST Dust. The power % increase of the PV modules exposed to the ASTM Arizona Test Dust over the control PV module exposed to dirt are shown in FIGS. 6-7.

Each of the dirty PV modules was then washed by rinsing with deionized (DI) water from a laboratory wash bottle obtained from VWR Scientific, Radnor, PA. A steady stream of DI water was sprayed onto the PV module with even sweeps across the PV module until no more dirt would wash off. The power output of the washed PV modules was measured with the flash tester ("SPI-SUN SIMULATOR 3500SLP"). The power % increase over the control PV module is shown in FIGS. 6-7.

Figure 6:
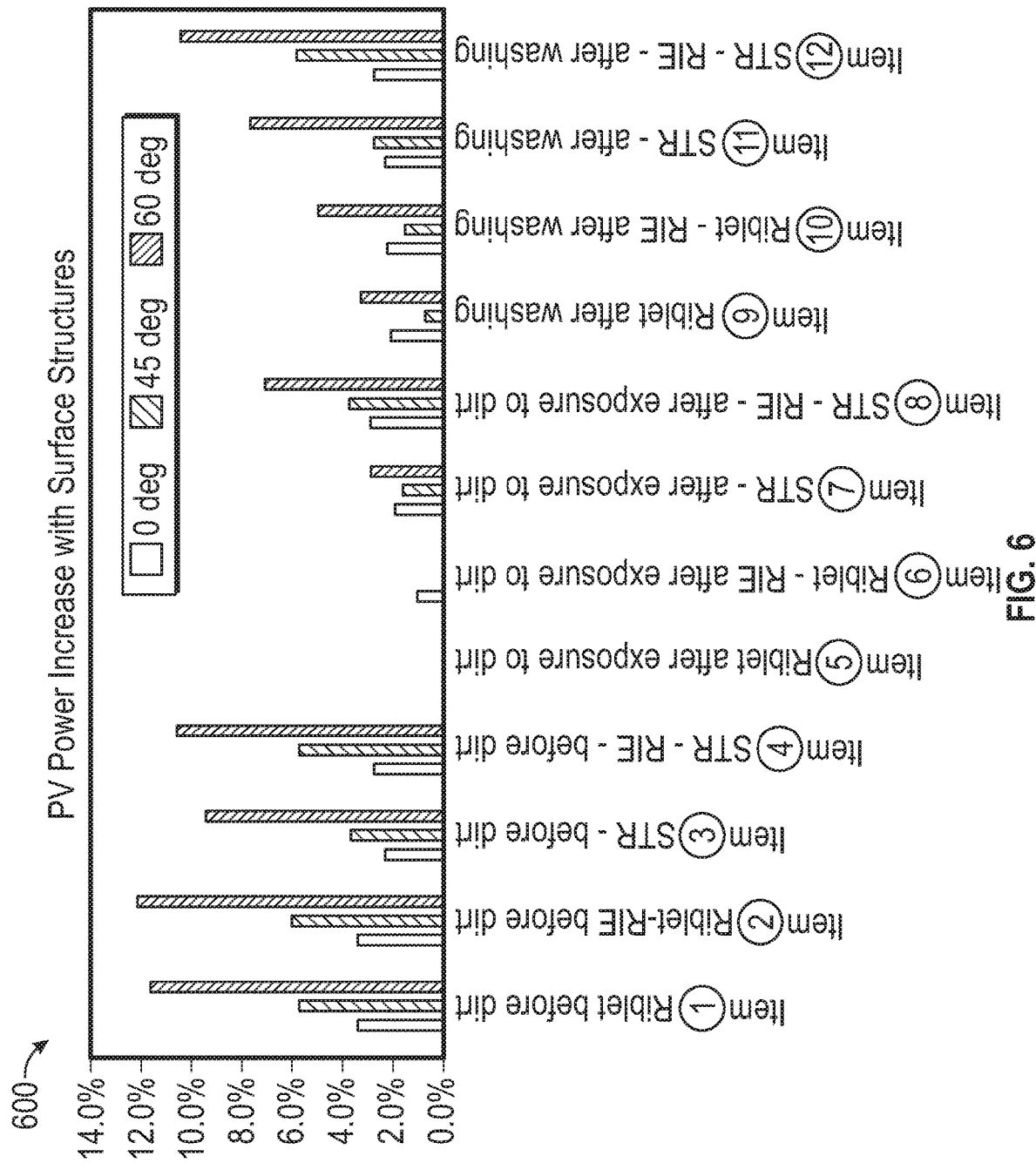
FIG. 6 is a chart showing relative power increase of a photovoltaic module based on different forms of anti-reflective surface structures tested.

FIG. 6 shows chart 600 illustrating the results of films tested before the addition of dirt (Items 1-4). The results of films tested after the addition of dirt (Items 5-8, respectively). The results of films tested after washing the dirt away (Items 9-12, respectively). FIG. 7 shows the same results in the form of table 700.

Dirt resistances of surface structured film samples were also measured by measuring the light transmission % using a haze meter obtained under the trade designation "HAZE GARD PLUS" from BYK-Gardner USA, Wallingford, CT, according to ASTM D1003 (2013). The measurement steps included: (1) calibration of the haze meter using standards provided with the haze meter; (2) placing a clean 5×5 cm film sample over a haze port in front of an integrating sphere with micro-structures oriented in vertical direction and facing light source; and (3) activating a light source by pushing "operate" button; and (4) recording transmission value displayed on a screen.

Measurements were made prior to dirt exposure, after dirt exposure, and after washing, as described above. Second surface reflection was calculated by measuring light transmission % of smooth polymer films and dividing by two. The second surface reflection was then subtracted from the light transmission % on each of the surface structured films to provide the resulting increase in light transmission % due to the surface structure on the front surface of the surface structured film. Light transmission % of the surface structure film was measured with the haze meter ("HAZE GARD PLUS") and the results are shown in FIG. 14.

Reactive Ion Etching Method

In the examples, reference is made to a nano-sized masking element. The masking element used had a size in the range of 1 nanometer to 500 nanometers, and was deposited in-situ with the reactive ion etching process treatment as described in U.S. Pat. Pub. 2017/0067150 (David et al.). For each film, a roll of film was mounted within a plasma vapor deposition reacting chamber, the film wrapped around a drum electrode, and secured to the take up roll on the opposite side of the drum. The un-wind and take-up tensions were maintained at 3 pounds (13.3 N). The chamber door was closed, and the chamber pumped down to a base pressure of $5 \times 10^{-4}$ Torr. A first gaseous species of hexamethyldisiloxane (HMDSO) vapor was provided at 50 standard cubic centimeters per minute (sccm), and a second gaseous species of oxygen was provided at a flow rate of 750 sccm. The pressure during the exposure was around 1.3 Pa (10 mTorr). Plasma power was maintained at 7500 watts, and line speed of the film was 0.9 meters per minute (3 feet/min).

COMPARATIVE EXAMPLE

In this comparative example, a prototype photovoltaic module was formed without a surface structured film (1). The prototype photovoltaic module was subjected to the dirt testing. Results in FIGS. 6-7 show measurements of the Illustrative Examples 1-3 and Example 1 in comparison to measurements of the Comparative Example.

Illustrative Example 1

In Illustrative Example 1, a riblet polyvinylidene fluoride (PVDF) film with micro-structured linear prisms forming a riblet prismatic surface was made as follows. PVDF polymer was obtained under the trade designation "3M DYNEON PVDF 6008" obtained from 3M Company. An extrusion replication casting roll was created by a diamond turning machine (DTM) method. The PVDF polymer was extruded onto the extrusion replication casting roll having a surface temperature of 82.2° C. (180° F.) at an extrusion rate of 40.8 kg./hr. (90 lb./hr.) and a casting roll speed of 12.2 meters per minute (40 fpm). A nip force of 4136.9 kPa (600 psi) was applied to the polymer as it contacted the extrusion replication casting roll to produce the PVDF riblet film.

Figure 8:
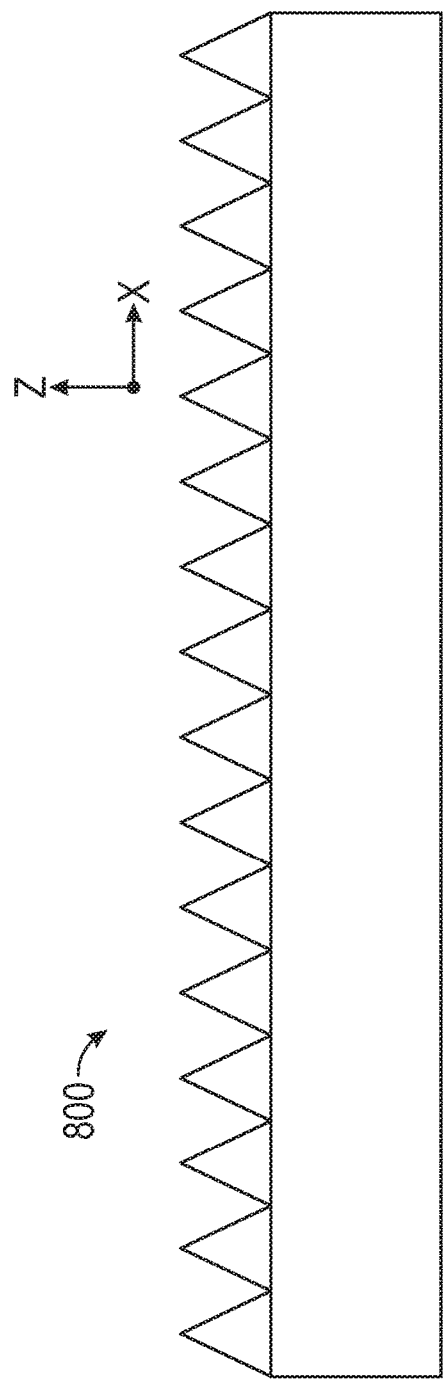
FIG. 8 a cross-sectional illustration of one embodiment of an anti-reflective surface structure with micro-structures without a skipped tooth riblet (STR) pattern in an xz-plane.

A cross-sectional view of the micro-structured surface 800 of Illustrative Example 1 is illustrated in FIG. 8. The micro-structured surface had prisms having a height of 75 micrometers with 70-degree tip angles.

The PVDF riblet film was then laminated to form one of the prototype photovoltaic modules, which was subjected to the dirt testing method. Power measurements relative to those for the Comparative Example are shown in chart 600 of FIG. 6 and table 700 of FIG. 7 (riblet before dirt, Item 1; riblet after exposure to dirt, Item 5; and riblet after rinsing with water, Item 9).

Illustrative Example 2

In Illustrative Example 2, a reactive ion etched (RIE) PVDF riblet film with micro-structured linear prisms, which in turn had nano-structures was made as follows. A riblet PVDF film was made as described in Illustrative Example 1. The riblet PVDF film was then exposed to the nano-structure-generating reactive ion etching (RIE) treatment to form a columnar nano-structure on the micro-structured prisms, thereby producing the riblet-RIE PVDF film.

Figure 9:
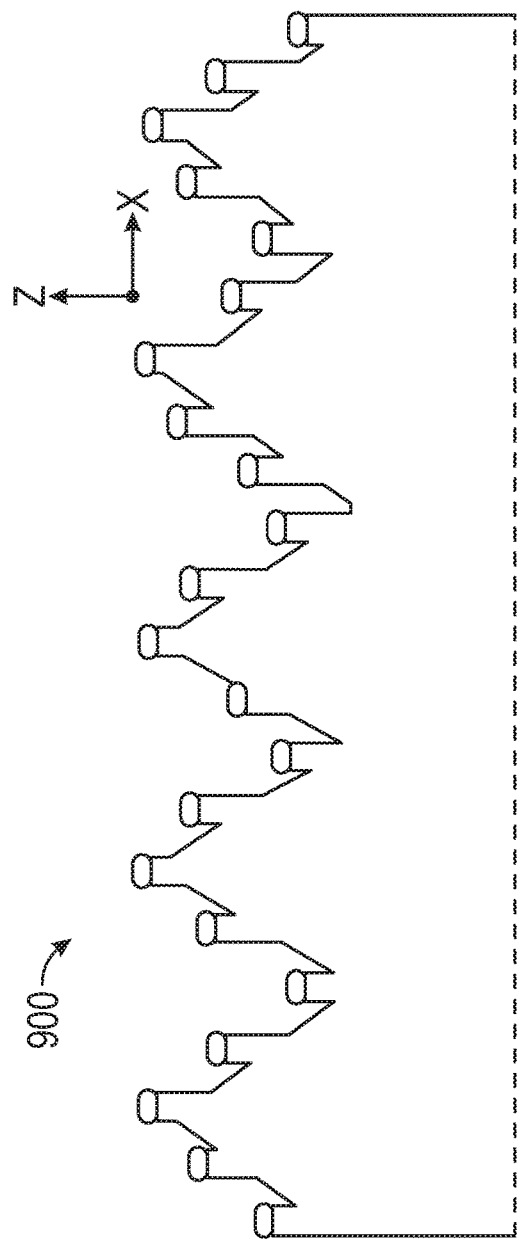
FIG. 9 is a cross-sectional illustration of another embodiment of an anti-reflective surface structure with micro-structures and nano-structures without an STR pattern in an xz-plane.

A cross-sectional view of the resulting surface 900 of Illustrative Example 2 is illustrated in FIG. 9.

The PVDF Riblet-RIE film was then laminated to form one of the prototype photovoltaic modules, which was subjected to the dirt testing method. Power measurements relative to those for the Comparative Example are shown in chart 600 of FIG. 6 and table 700 of FIG. (riblet-RIE before dirt, Item 2; riblet-RIE after exposure to dirt, Item 6; riblet-RIE after rinsing with water, Item 10).

Illustrative Example 3

In Illustrative Example 3, a skipped tooth riblet (STR) PVDF film with micro-structured linear prisms spaced apart with flat lanes separating the linear prisms was made as follows. An extrusion replication casting roll having a riblet prismatic surface was created by a diamond turning machine (DTM) method. PVDF polymer ("3M DYNEON PVDF 6008") was extruded onto the extrusion replication casting roll having the riblet prismatic surface. The PVDF polymer was extruded onto the extrusion replication casting roll having a surface temperature of 82.2° C. (180° F.) at an extrusion rate of 40.8 kg./hr. (90 lb./hr.) and a casting roll speed of 12.2 meters per minute (40 fpm). A nip force of 4136.9 kPa (600 psi) was applied to the polymer as it contacted the extrusion replication casting roll to produce the STR PVDF film.

A cross-sectional view of resulting surface 202 is illustrated in FIG. 2C.

The STR PVDF riblet film was then laminated to form one of the prototype photovoltaic modules, which was subjected to the dirt testing method. Power measurements relative to those for the Comparative Example are shown in chart 600 of FIG. 6 and table 700 of FIG. 7 (STR before dirt, Item 3; STR after exposure to dirt, Item 7; STR after washing, Item 11). Percent transmission measurements are shown in table 750 of FIG. 14 (PVDF STR sample).

Illustrative Example 4

In Illustrative Example 4, a skipped tooth riblet (STR) multi-layer fluoropolymer film with micro-structured linear prisms spaced apart with flat lanes separating the linear prisms was made as follows. An extrusion replication casting roll having a riblet prismatic surface was created by a diamond turning machine (DTM) method. A multi-layer layer fluoropolymer film comprising a first fluoropolymer layer of THV815 ("3M DYNEON THV815"), a second fluoropolymer layer ("3M DYNEON THV221,"), and third fluoropolymer layer ("3M DYNEON PVDF 6008") were extruded with the first fluoropolymer layer against the extrusion replication casting roll having the riblet prismatic surface. The extrusion rate of each fluoropolymer layer was 13.6 kg./hr. (30 lb./hr.). All three fluoropolymer layers were coextruded onto the extrusion replication casting roll having a surface temperature of 82.2° C. (180° F.) at a total extrusion rate of 40.8 kg./hr. (90 lb./hr.) and a casting roll speed of 12.2 meters per minute (40 fpm). A nip force of 4136.9 kPa (600 psi) was applied to the polymer as it contacted the extrusion replication casting roll to produce the STR PVDF film.

A cross-sectional view of resulting surface 1505 is illustrated in FIG. 15. Percent transmission measurements are shown in table 750 of FIG. 14 (THV815 3-layer STR sample).

Example 1

In Example 1, an STR-RIE PVDF film with micro-structured linear prisms spaced apart with flat lanes separating the linear prisms having nano-structures was made as follows. An STR PVDF film was made as described in Illustrative Example 3 and then exposed to the nano-structure-generating reactive ion etching (RIE) treatment to form a columnar nano-structure on the micro-structured prisms and flat lanes, thereby producing the STR-RIE PVDF film.

A cross-sectional view of the resulting surface 404 is illustrated in FIG. 4.

The STR-RIE PVDF film was then laminated to form one of the prototype photovoltaic modules, which was subjected to the dirt testing method. Power measurements relative to those for the Comparative Example are shown in chart 600 of FIG. 6 and table 700 of FIG. 7 (STR-RIE before dirt, Item 4; STR-RIE after exposure to dirt, Item 8; STR-RIE after washing, Item 12). Percent transmission measurements are shown in table 750 of FIG. 14 (PVDF-STR-RIE sample).

Example 2

In Example 2, an STR HTE1705 film (obtained under the trade designation "3M DYNEON HTE1705" from 3M Company) with micro-structured linear prisms spaced apart with flat lanes separating the linear prisms was made as follows. The polymer ("HTE1705") was extruded onto the extrusion replication casting roll as described in Illustrative Example 3 to produce the STR HTE1705 film.

A cross-sectional view of resulting surface 202 is illustrated in FIG. 2C.

The STR HTE1705 film was then laminated to form one of the prototype photovoltaic modules, which was subjected to the dirt testing method. Only measurements using the haze meter were performed. Percent transmission measurements are shown in table 750 of FIG. 14 (HTE1705 STR sample).

Example 3

In Example 3, an STR-RIE HTE1705 film with micro-structured linear prisms spaced apart with flat lanes separating the linear prisms having nano-structures was made as follows. A riblet PVDF film was made as described in Example 2 and then exposed to the nano-structure-generating reactive ion etching (RIE) treatment to form a columnar nano-structure on the micro-structured prisms and flat lanes, thereby producing the STR-RIE HTE1705 film.

A cross-sectional view of the resulting surface 404 is illustrated in FIG. 4.

The STR-RIE HTE1705 film was then laminated to form one of the prototype photovoltaic modules, which was subjected to the dirt testing method. Only measurements using the haze meter were performed. Percent transmission measurements are shown in table 750 of FIG. 14 (HTE1705 STR-RIE sample).

Example 4

In Example 4, a smooth surface PVDF film and matte surface structured PVDF film were obtained under the trade designation "ROWLAR" from Rowland Company, Wallingford, CT. The matte surface had random micro-structures without micro-spaces. The smooth surface and matte surface PVDF films were then tested for transmission using the haze meter ("HAZE GARD PLUS") using the dirt testing method. Only measurements using the haze meter were performed. Percent transmission measurements are shown in table 750 of FIG. 14 (PVDF Smooth and PVDF Matte samples).

Example 5

In Example 5, a smooth surface ETFE film and a matte surface structured ETFE film obtained under the trade designation "NOWOFLON ET6235" from NOWOFOL, Siegsdorf, Germany. The matte surface had random micro-structures without micro-spaces. The smooth surface and matte surface ETFE films were then tested for transmission using the haze meter ("HAZE GARD PLUS") using the dirt testing method. Only measurements using the haze meter were performed. Percent transmission measurements are shown in table 750 of FIG. 14 (ETFE smooth and ETFE matte samples).

Example 6

In Example 6, a 3-layer die was used to simultaneously coextrude 3 fluoropolymers into a 3-layer film as described in Illustrative Example 4. The THV815 surface was micro-replicated with a casting wheel extrusion replication process as described in Illustrative Example 4, and then exposed to the nano-structure-generating reactive ion etching (RIE) treatment to form a columnar nano-structure on the micro-structured prisms and flat lanes, thereby producing the STR-RIE THV815 3-layer film. A cross-sectional view of resulting surface is similar to surface 1505 illustrated in FIG. 15, except that nano-structures were added to the surface. The film was then tested for transmission using the haze meter ("HAZE GARD PLUS") using the dirt testing method. Only measurements using the haze meter were performed. Percent transmission measurements are shown in table 750 of FIG. 14 (THV815 3-layer STR-RIE sample).

Prophetic Example I

An STR-diamond turning machine (DTM) film with micro-structured linear prisms spaced apart with flat lanes separating the linear prisms having nano-structures could be produced. An STR film could be made similar to Example 3, but with nano-structures, by creating a diamond turned casting roll tool (e.g., a micro-replication tool with ion-etched diamond) having nano-structures with nano-milled diamonds capable of creating an extrusion replicated film is shown as surface 202 shown in FIG. 3. It is anticipated that this STR-DTM film would have comparable anti-reflective and dirt resistance to STR-RIE film made and tested in Example 4.

Prophetic Example II

An STR-electrochemical deposition (ECD) film with micro-structured linear prisms spaced apart with flat lanes separating the linear prisms having nano-structures could be produced. An STR could be made similar to Example 3, but with nano-structures, by creating a die casting roll tool (e.g., a micro-replication tool with nano-structured granular plating) having an electro-chemically deposited plating or coating with nano-structures capable of creating an extrusion replicated film similar to that shown as surface 202 in FIG. 3. It is anticipated that this STR-ECD film would have comparable anti-reflective and dirt resistance to STR-RIE film made and tested in Example 4.

Thus, various embodiments of anti-reflective surface structures are disclosed. Although reference is made herein to the accompanying set of drawings that form part of this disclosure, one of at least ordinary skill in the art will appreciate that various adaptations and modifications of the embodiments described herein are within, or do not depart from, the scope of this disclosure. For example, aspects of the embodiments described herein may be combined in a variety of ways with each other. Therefore, it is to be understood that, within the scope of the appended claims, the claimed invention may be practiced other than as explicitly described herein.

The complete disclosures of the patents, patent documents, and publications cited herein are incorporated by reference in their entirety as if each were individually incorporated. To the extent that there is any conflict or discrepancy between this specification as written and the disclosure in any document that is incorporated by reference herein, this specification as written will control.

What is claimed is:

1. An article comprising a layer defining an anti-reflective surface extending along an axis, wherein a plane containing the axis defines a cross section of the layer and intersects the surface to define a line describing the surface in two dimensions, the layer comprising:
   a series of micro-structures at least partially defined by the line, the line defining a series of alternating micro-peaks and micro-spaces along the axis, wherein each micro-space comprises a maximum absolute slope defining an angle from the axis of at most 30 degrees, wherein each micro-peak comprises a first micro-segment defining a first average slope and a second micro-segment defining a second average slope, and wherein an angle formed between the first and second average slopes is at most 120 degrees; and
   a plurality of nano-structures at least partially defined by the line, the line defining at least one series of nano-peaks disposed on at least the micro-spaces along the axis,
   wherein each nano-peak has a height and each corresponding micro-peak has a height of at least 10 times the height of the nano-peak, and
   wherein the micro-spaces have a width of at least 50 micrometers.

2. An article comprising a layer defining an anti-reflective surface extending along an axis, wherein a plane containing the axis defines a cross section of the layer and intersects the surface to define a line describing the surface in two dimensions, the layer comprising:
   a series of micro-structures at least partially defined by the line, the line defining a series of alternating micro-peaks and micro-spaces along the axis, wherein a boundary between each adjacent micro-peak and micro-space includes at least one of a bend or an inflection point of the line; and
   a plurality of nano-structures at least partially defined by the line, the line defining at least one series of nano-peaks disposed on at least the micro-spaces along the axis,
   wherein each nano-peak has a height and each corresponding micro-peak has a height at least 10 times the height of the nano-peak, and
   wherein the micro-spaces have a width of at least 50 micrometers.

3. The article of claim 1, wherein the micro-peak first average slope is positive, and the micro-peak second average slope is negative.

4. The article of claim 1, wherein an absolute value of the micro-peak first average slope is equal to an absolute value of the micro-peak second average slope.

5. The article of claim 1, wherein a width of each micro-space is at least one of: at least 10% of a corresponding micro-peak distance.

6. The article of claim 1, wherein a micro-peak distance between micro-peaks is at least 100 micrometers.

7. The article of claim 1, wherein the micro-peaks have a height of at least 10 micrometers.

8. The article of claim 1, wherein each nano-peak comprises a first nano-segment defining a first average slope and a second nano-segment defining a second average slope, wherein an angle formed between the nano-peak first average slope and the nano-peak second average slope is at most 120 degrees.

9. The article of claim 8, wherein an absolute value of the nano-peak first average slope is different than an absolute value of the nano-peak second average slope.

10. The article of claim 1, wherein the plurality of nano-structures is further disposed on the micro-peaks.

11. The article of claim 1, wherein each nano-peak defines a nano-peak distance and the corresponding micro-peaks define a micro-peak distance of at least 10 times the nano-peak distance.

12. The article of claim 1, wherein a maximum nano-peak distance between nano-peaks is in a range from 1 nanometer to 1 micrometer.

13. The article of claim 1, wherein the layer defining the anti-reflective surface comprises at least one of a fluoropolymer, a polyolefin polymer, or an ultraviolet stable material.

14. The article of claim 1, wherein the nano-peaks comprise at least one masking element.

15. The article of claim 14, wherein the masking element has a diameter of at most 1 micrometer.

16. The article of claim 1, wherein the micro-peaks are non-uniform in at least one of height or shape.

17. The article of claim 1, further comprising an ultraviolet stable adhesive coupled to a side of the layer opposite to the anti-reflective surface, wherein the adhesive is at least one of self-wetting to glass or an air bleed adhesive.

18. A method of forming an article comprising a layer defining an anti-reflective surface, the method comprising:

forming a series of micro-structures on a surface of a layer, the series of micro-structures comprising a series of alternating micro-peaks and micro-spaces along an axis;

disposing a series of nano-sized masking elements on at least the micro-spaces along the axis, wherein the masking elements define a maximum diameter and the corresponding micro-peaks have a height of at least 10 times the maximum diameter of the masking elements; and exposing the surface of the layer to reactive ion etching to form a plurality of nano-structures on the surface of the layer including a series of nano-peaks along the axis, each nano-peak comprising the masking element and a column between the masking element and the layer, wherein the micro-spaces have a width of at least 50 micrometers.

19. A method of forming an article comprising a layer defining an anti-reflective surface, the method comprising:

extruding a hot melt material comprising an ultraviolet-stable material;

shaping the extruded material with a micro-replication tool comprising a mirror image of a series of micro-structures to form the series of micro-structures on the surface of the layer, the series of micro-structures comprising a series of alternating micro-peaks and micro-spaces along an axis; and forming a plurality of nano-structures on the surface of the layer on at least the micro-spaces, the plurality of nano-peaks comprising at least one series of nano-peaks along the axis, wherein the micro-spaces have a width of at least 50 micrometers.

20. The method of claim 19, wherein the plurality of nano-peaks comprises at least one series of nano-peaks along the axis.

* * * * *